US012278610B2

(12) United States Patent
Ogawa

(10) Patent No.: US 12,278,610 B2
(45) Date of Patent: Apr. 15, 2025

(54) MULTILAYER LC FILTER

(71) Applicant: Murata Manufacturing Co., Ltd., Nagaokakyo (JP)

(72) Inventor: Keisuke Ogawa, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 22 days.

(21) Appl. No.: 18/228,708

(22) Filed: Aug. 1, 2023

(65) Prior Publication Data
US 2023/0412137 A1 Dec. 21, 2023

Related U.S. Application Data

(63) Continuation of application No. PCT/JP2022/007431, filed on Feb. 22, 2022.

(30) Foreign Application Priority Data

Feb. 26, 2021 (JP) ................ 2021-031266

(51) Int. Cl.
H03H 7/01 (2006.01)
H01F 17/00 (2006.01)
(Continued)

(52) U.S. Cl.
CPC ....... *H03H 7/0115* (2013.01); *H01F 17/0013* (2013.01); *H01G 4/40* (2013.01);
(Continued)

(58) Field of Classification Search
CPC ............. H03H 7/0115; H03H 7/1775; H03H 2001/0085; H03H 7/1708; H01F 2017/0026; H01F 17/0013; H01G 4/40
(Continued)

(56) References Cited

U.S. PATENT DOCUMENTS 8,760,242 B2 * 6/2014 Tamaru ................ H03H 7/1775
333/176
2007/0241839 A1 10/2007 Taniguchi
(Continued)

FOREIGN PATENT DOCUMENTS

JP 2013128232 A 6/2013
JP 5549744 B2 7/2014
(Continued)

OTHER PUBLICATIONS

International Search Report in PCT/JP2022/007431, mailed Apr. 26, 2022, 4 pages.
(Continued)

*Primary Examiner* — Arnold M Kinkead
(74) *Attorney, Agent, or Firm* — Keating & Bennett, LLP

(57) ABSTRACT

Multiple LC parallel resonators in which inductors and capacitors are connected in parallel are located inside a multilayer body. The inductors each include a loop inductor including a line-shaped conductor pattern and at least one pair of via conductors connected to the line-shaped conductor pattern. When the multilayer body is seen through in a height direction, in all the loop inductors of the LC parallel resonators, open via conductors are closer to a center of the multilayer body, and short-circuit via conductors are closer to an outer side of the multilayer body in at least one of a width direction and a length direction.

20 Claims, 25 Drawing Sheets

(51) Int. Cl.
*H01G 4/40* (2006.01)
*H03H 1/00* (2006.01)

(52) U.S. Cl.
CPC ........ *H03H 7/1708* (2013.01); *H03H 7/1775* (2013.01); *H01F 2017/0026* (2013.01); *H03H 2001/0085* (2013.01)

(58) Field of Classification Search
USPC ............. 331/117 FE, 167; 336/200; 333/185
See application file for complete search history.

(56) References Cited

U.S. PATENT DOCUMENTS

| 2010/0007437 | A1* | 1/2010 | Taniguchi | H03H 7/09 333/175 |
| 2012/0119852 | A1* | 5/2012 | Sasaki | H03H 7/42 333/204 |
| 2013/0154769 | A1 | 6/2013 | Masuda | |
| 2013/0229241 | A1 | 9/2013 | Imamura | |
| 2013/0241672 | A1 | 9/2013 | Tamaru et al. | |
| 2014/0145798 | A1 | 5/2014 | Masuda | |
| 2019/0288659 | A1 | 9/2019 | Oishi | |

FOREIGN PATENT DOCUMENTS

| WO | 2007119356 A1 | 10/2007 |
| WO | 2012066873 A1 | 5/2012 |
| WO | 2012066946 A1 | 5/2012 |
| WO | 2012077498 A1 | 6/2012 |
| WO | 2017169354 A1 | 10/2017 |
| WO | 2018100918 A1 | 6/2018 |

OTHER PUBLICATIONS

Written Opinion in PCT/JP2022/007431, mailed Apr. 26, 2022, 5 pages.

* cited by examiner

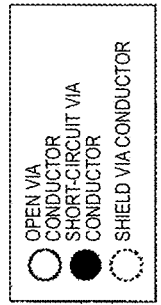
FIG. 18B
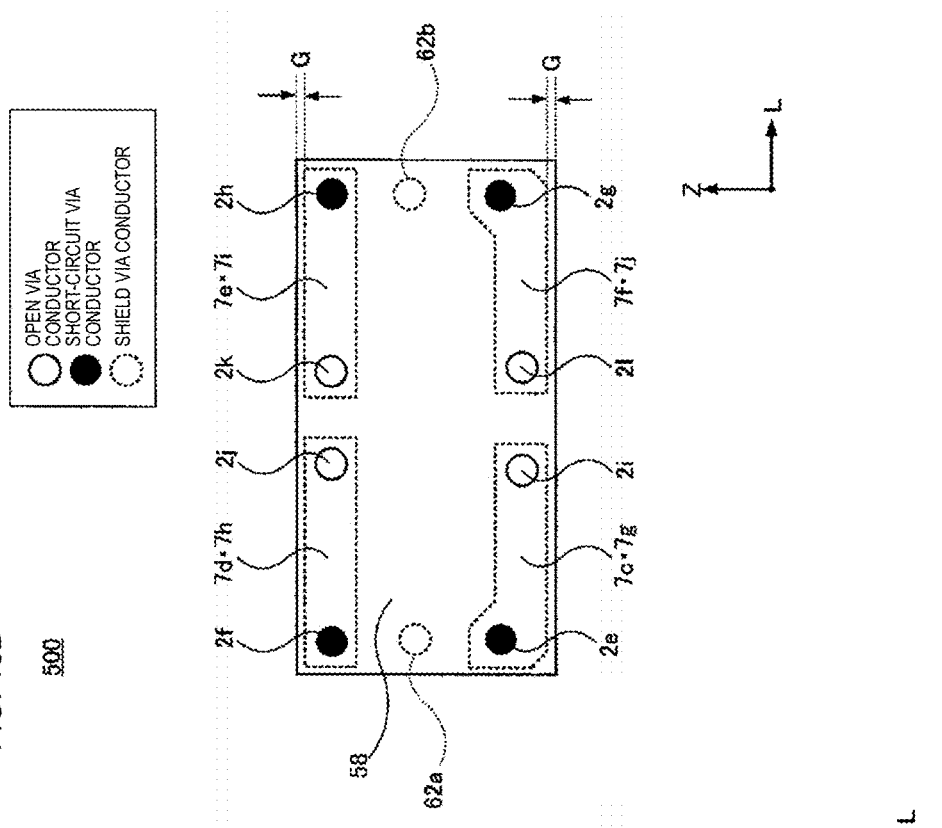
FIG. 18A
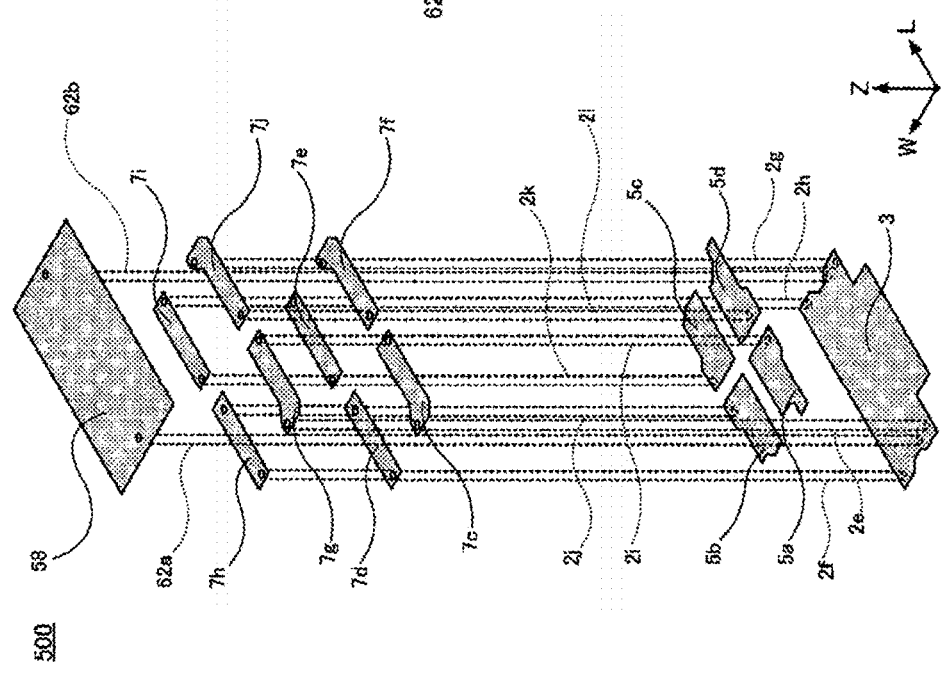

510

510

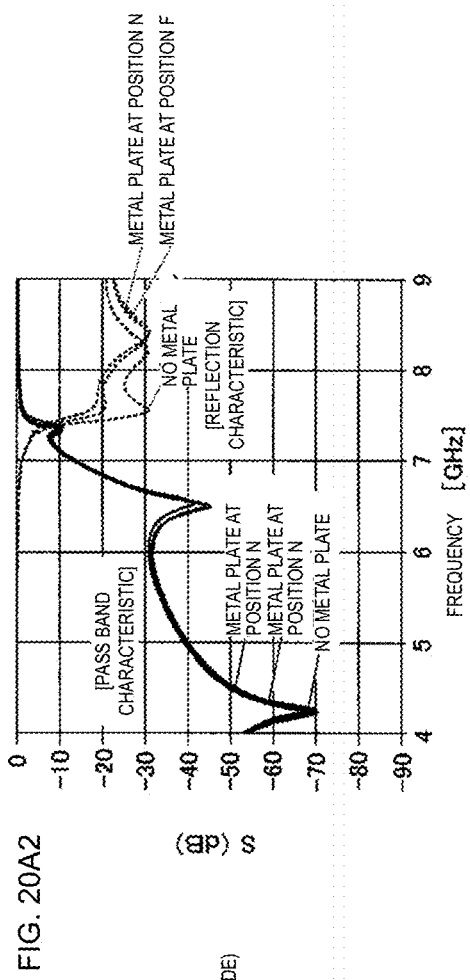
FIG. 20A1   FIG. 20A2
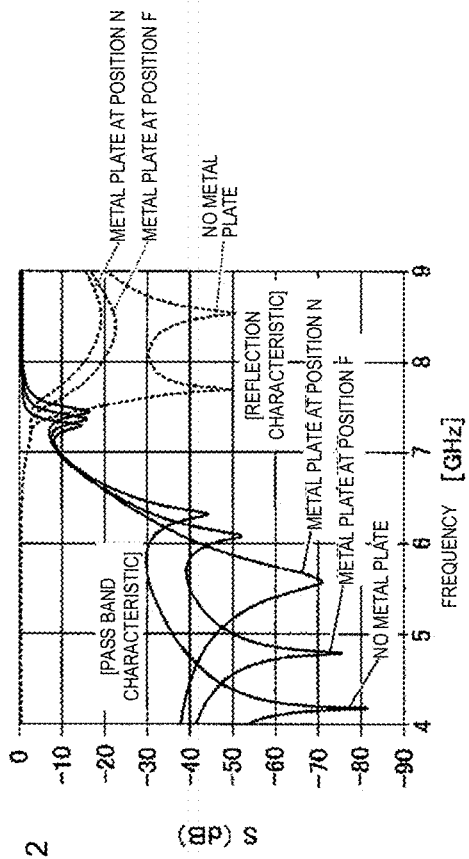
FIG. 20B1   FIG. 20B2

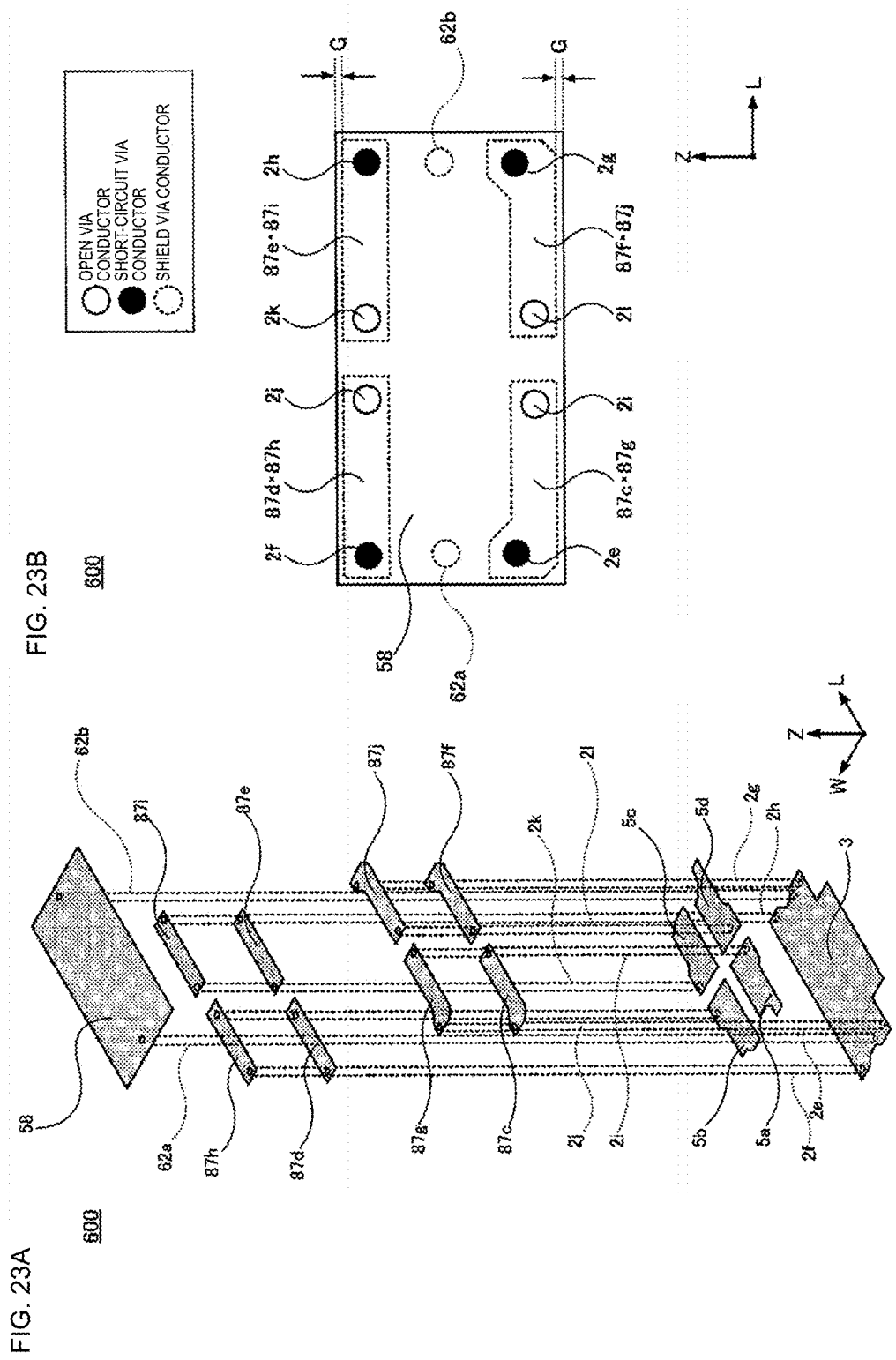

FIG. 24A
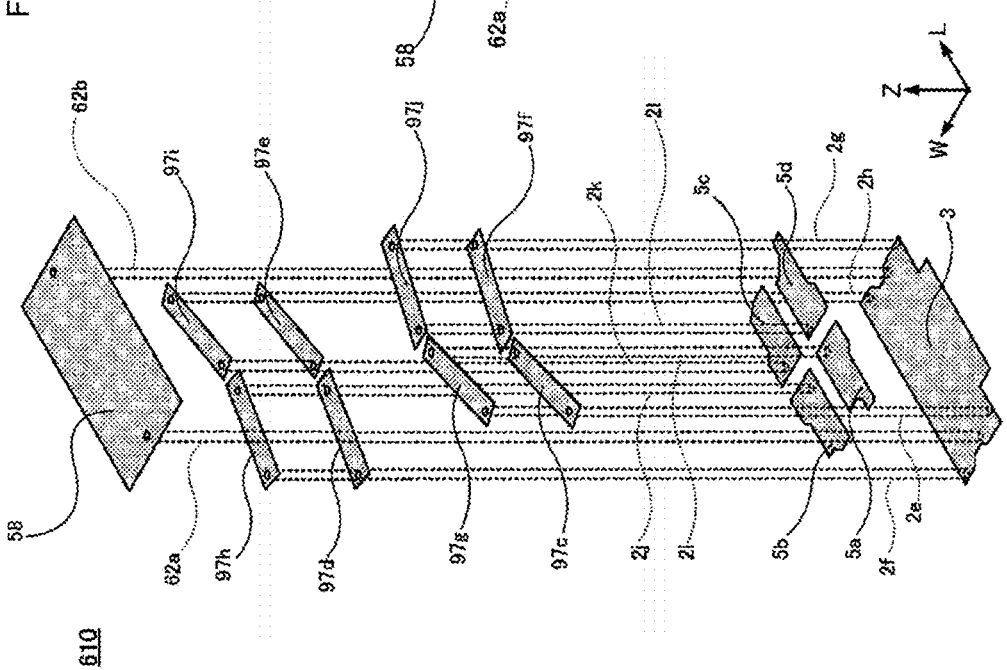
FIG. 24B
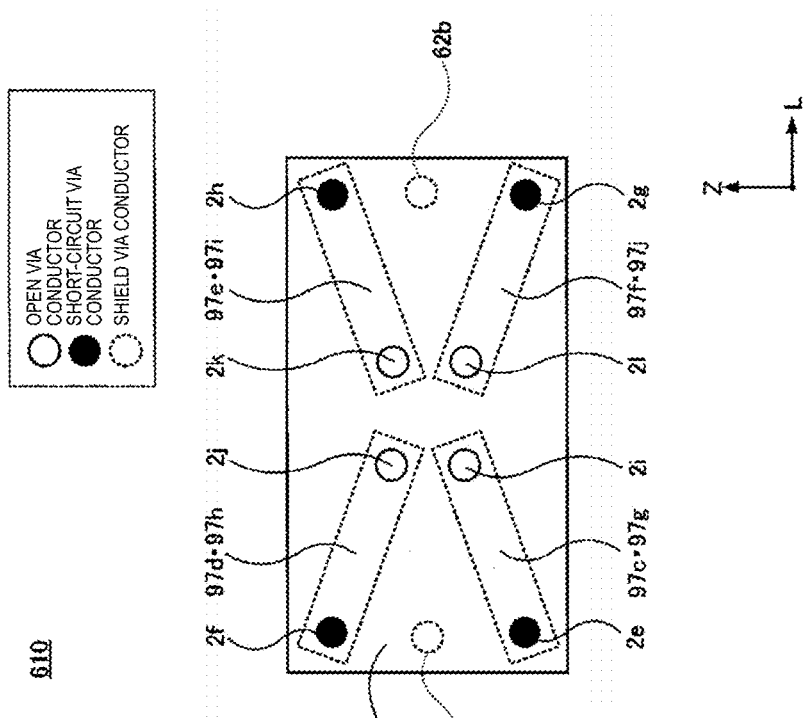
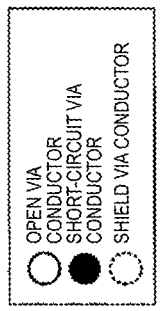

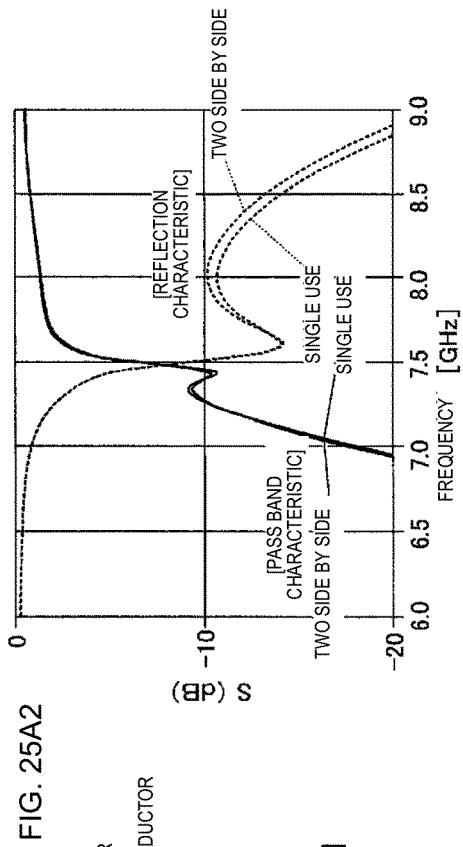
FIG. 25A1
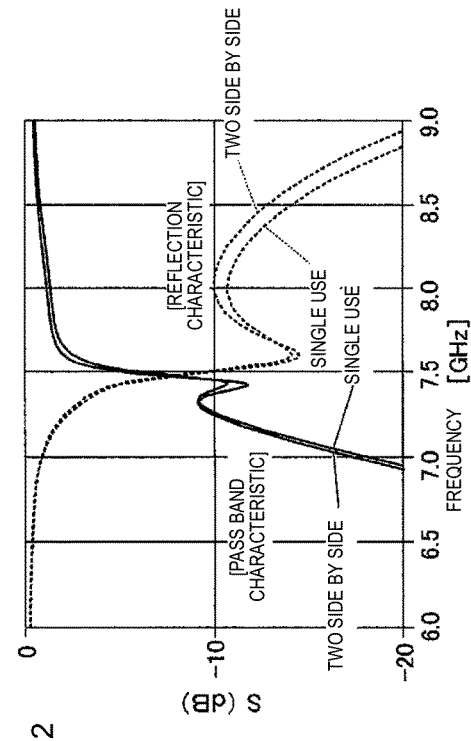
FIG. 25A2
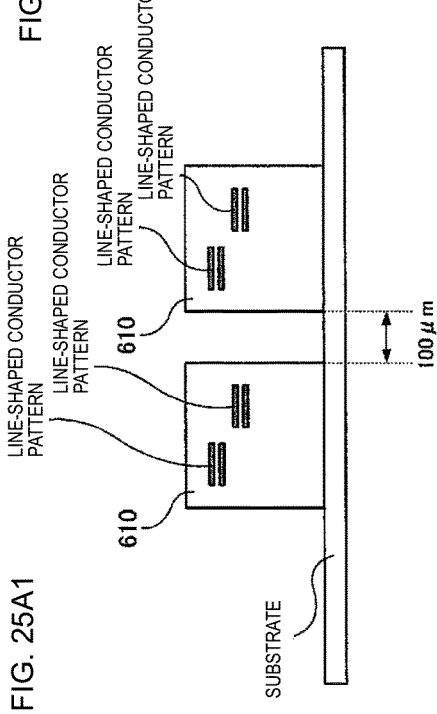
FIG. 25B1
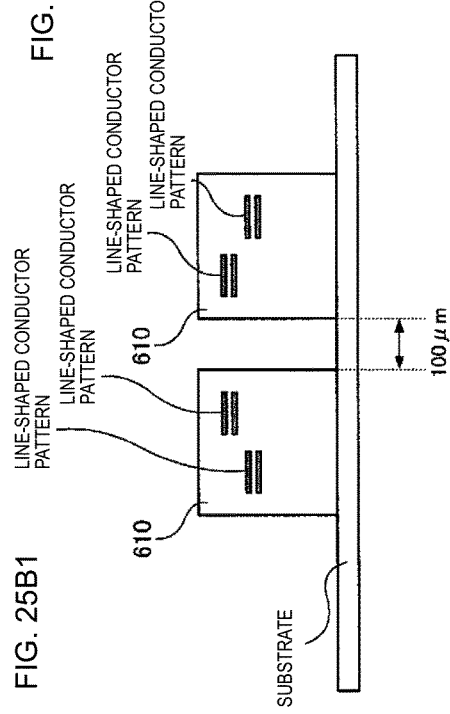
FIG. 25B2

MULTILAYER LC FILTER

CROSS REFERENCE TO RELATED APPLICATIONS

This application claims the benefit of priority to Japanese Patent Application No. 2021-031266 filed on Feb. 26, 2021 and is a Continuation Application of PCT Application No. PCT/JP2022/007431 filed on Feb. 22, 2022. The entire contents of each application are hereby incorporated herein by reference.

BACKGROUND OF THE INVENTION

1. Field of the Invention

The present invention relates to a multilayer LC filter in which multiple LC parallel resonators are inside of a multilayer body including multiple dielectric layers laminated on each other.

2. Description of the Related Art

Multilayer LC filters are widely used in various electronic devices. Various filters such as a band pass filter, a low pass filter, and a high pass filter are configured of the multilayer LC filter.

In a filter, generally, a pole is formed outside a pass band to obtain a preferable pass band characteristic. For example, in a case of a standard band pass filter, poles having substantially the same attenuation are provided on a low frequency side and a high frequency side relative to a pass band in many cases.

However, with the specification of an electronic device in which a multilayer LC filter is used, the pass band characteristic of a filter may be required to have a feature different from that of a standard pass band characteristic. For example, in a band pass filter, there is a case that the attenuation of a pole on the low frequency side is required to be larger than the attenuation of a pole on the high frequency side. However, this is merely an example and is not limited to this, and various features may be required for a pass band characteristic.

In the case above, specific LC parallel resonators separated from each other in an equivalent circuit are provided with jump-coupling with capacitive coupling or the like to obtain a desired pass band characteristic, for example.

Japanese Patent No. 5549744 discloses a multilayer LC filter which may be a reference of the present invention. In the multilayer LC filter, an inductor of an LC parallel resonator is configured by a so-called loop inductor. That is, an inductor is formed as a loop inductor by connecting via conductors, formed to penetrate through dielectric layers, to both ends of a line-shaped conductor pattern provided on a certain dielectric layer of a multilayer body, respectively.

In the multilayer LC filter of Japanese Patent No. 5549744, a multilayer body is formed by laminating dielectric layers having a relatively large size in a planar direction. Further, in the multilayer LC filter of Japanese Patent No. 5549744, a relatively large number of dielectric layers are laminated to form the multilayer body. Therefore, in the multilayer LC filter of Japanese Patent No. 5549744, a new jump-coupling conductor pattern is easily provided inside the multilayer body, and thus, a desired pass band characteristic is easily obtained by making specific LC parallel resonators separated from each other in an equivalent circuit be made jump-coupling with capacitive coupling. Note that, in the multilayer LC filter of Japanese Patent No. 5549744, each loop inductor of each LC parallel resonator is disposed as follows, when the multilayer body is seen through in a height direction. In a length direction, a short-circuit via conductor connecting a line-shaped conductor pattern and a ground conductor pattern is disposed closer to a center of the multilayer body, and an open via conductor connecting a line-shaped conductor pattern and a capacitor conductor pattern is disposed closer to an outer side of the multilayer body.

However, in recent years, with the reduction of electronic devices in size, electronic components including a used multilayer LC filter are also requested to be reduced in size. For example, also in a multilayer LC filter, a size of the dielectric layer in a planar direction is requested to be smaller than that in the past, and the number of dielectric layers to be laminated is requested to be smaller than that in the past. Further, it is requested to form a necessary number of LC parallel resonators inside the multilayer body above, and not to deteriorate characteristics including the pass band characteristic.

A multilayer LC filter reduced in size is disclosed in WO 2007/119356 A1. In the multilayer LC filter above, an inductor of each LC parallel resonator is formed by a loop inductor having a structure in which via conductors are connected to both ends of a line-shaped conductor pattern provided on a certain layer of a multilayer body, respectively.

In the multilayer LC filter of WO 2007/119356 A1, the line-shaped conductor patterns of the loop inductor of the inductor of each LC parallel resonator are disposed side by side in parallel to each other inside the multilayer body. For example, in a case of a four stage band pass filter, line-shaped conductor patterns of a loop inductor of an inductor of each of a first to fourth stage resonators are disposed side by side in parallel to each other.

As a result, in the multilayer LC filter of WO 2007/119356 A1, the necessary number of LC parallel resonators are formed inside the multilayer body and a necessary circuit is formed, although the multilayer body is reduced in size by making the size of the dielectric layers in the planar direction be smaller than that in the past, and making the number of laminated dielectric layers be smaller than that in the past.

SUMMARY OF THE INVENTION

In the multilayer LC filter of WO 2007/119356 A1, it is hard to adjust the pass band characteristic by providing jump-coupling of specific LC parallel resonators separated from each other in an equivalent circuit with capacitive coupling.

That is, for example, in a case that the pass band characteristic is to be adjusted by newly adding a jump-coupling conductor pattern to let a first stage LC parallel resonator and a third stage LC parallel resonator be made jump-coupling with capacitive coupling, the jump-coupling conductor pattern is disposed to pass through the vicinity of the second stage LC parallel resonator. As a result, not only the first stage LC parallel resonator and the third stage LC parallel resonator are newly made jump-coupling, but also the coupling state of the first stage LC parallel resonator and the second stage LC parallel resonator, and the coupling state of the second stage LC parallel resonator and the third stage LC parallel resonator are changed, so that the basic pass band characteristic itself is deteriorated. That is, it has been hard to independently control the jump-coupling.

A preferred embodiment of the present invention provides a multilayer LC filter to transfer a signal from an input terminal to an output terminal, including a multilayer body in which multiple dielectric layers are laminated and multiple LC parallel resonators provided in the multilayer body and electromagnetically coupled to each other. The multilayer body includes a first line-shaped conductor pattern, a second line-shaped conductor pattern, and a third line-shaped conductor pattern between adjacent ones of the dielectric layers, a first capacitor conductor pattern, a second capacitor conductor pattern, and a third capacitor conductor pattern between adjacent ones of the dielectric layers, and at least one ground conductor pattern formed between adjacent ones of the dielectric layers. The multiple LC parallel resonators include a first LC parallel resonator, a second LC parallel resonator, and a third LC parallel resonator. The first LC parallel resonator includes the first line-shaped conductor pattern, a first open via conductor connecting the first line-shaped conductor pattern and the first capacitor conductor pattern, and a first short-circuit via conductor connecting the first line-shaped conductor pattern and the ground conductor pattern. The second LC parallel resonator includes the second line-shaped conductor pattern, a second open via conductor connecting the second line-shaped conductor pattern and the second capacitor conductor pattern, and a second short-circuit via conductor connecting the second line-shaped conductor pattern and the ground conductor pattern. The third LC parallel resonator includes the third line-shaped conductor pattern, a third open via conductor connecting the third line-shaped conductor pattern and the third capacitor conductor pattern, and a third short-circuit via conductor connecting the third line-shaped conductor pattern and the ground conductor pattern. When the multilayer body is seen through from a lamination direction, the first open via conductor is closer to the second open via conductor than to the second short-circuit via conductor and closer to the third open via conductor than to the third short-circuit via conductor, and the second open via conductor is closer to the third open via conductor than to the third short-circuit via conductor.

In a multilayer LC filter according to a preferred embodiment of the present invention, a first open via conductor is closer to a second open via conductor than to a second short-circuit via conductor and closer to a third open via conductor than to a third short-circuit via conductor, the second open via conductor is closer to the third open via conductor than to the third short-circuit via conductor, and a capacitor conductor pattern and/or an open via conductor of a capacitor of each LC parallel resonator is concentratively provided in the vicinity of a center of a multilayer body. This makes it easy to provide jump-coupling among LC parallel resonators separated from each other in an equivalent circuit with capacitive coupling.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 18A is an exploded perspective view of a main portion of the multilayer LC filter 500, and FIG. 18B is an explanatory view (perspective plan view) of the multilayer LC filter 500.

FIG. 20A1 and FIG. 20B1 are each explanatory diagrams of Experiment 1, and FIG. 20A2 and FIG. 20B2 are each characteristic diagrams of Experiment 1.

FIG. 23A is an exploded perspective view of a main portion of the multilayer LC filter 600, and FIG. 23B is an explanatory view (perspective plan view) of the multilayer LC filter 600.

FIG. 24A is an exploded perspective view of a main portion of a multilayer LC filter 610 according to a first modification of the multilayer LC filter 600, and FIG. 24B is an explanatory view (perspective plan view) of the multilayer LC filter 610.

FIG. 25A1 and FIG. 25B1 are each explanatory diagrams of Experiment 2, and FIG. 25A2 and FIG. 25B2 are each a characteristic diagram of Experiment 2.

DETAILED DESCRIPTION OF THE PREFERRED EMBODIMENTS

Hereinafter, preferred embodiments of the present invention will be described with reference to the drawings.

It should be noted that each preferred embodiment exemplifies a preferred embodiment of the present invention, and the present invention is not limited to the contents of the preferred embodiment. Contents described in different preferred embodiments can be combined for implementation, and the implemented contents in that case are also included in the present invention. The drawings are intended to facilitate understanding of the description and may schematically be drawn. Thus, a ratio of dimensions of an element or between elements that are drawn is not necessarily coincide with a ratio of dimensions described in the description. Further, there may be a case that an element described in the description is omitted in a drawing, a case that the number of elements is decreased, or the like.

First Preferred Embodiment: Multilayer LC Filter 100

Figure 1:
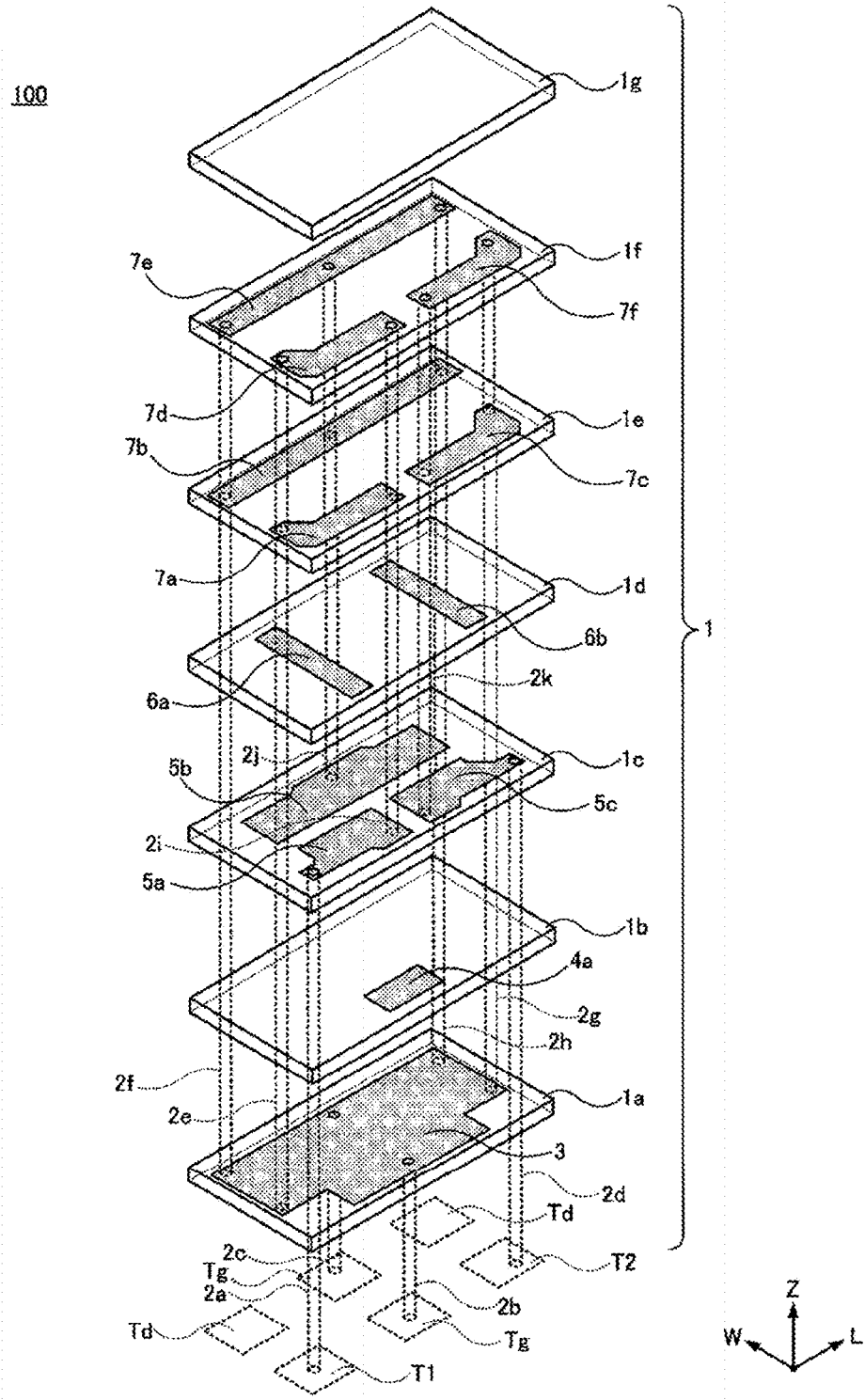
FIG. 1 is an exploded perspective view of a multilayer LC filter 100 according to a first preferred embodiment of the present invention.
Figure 2:
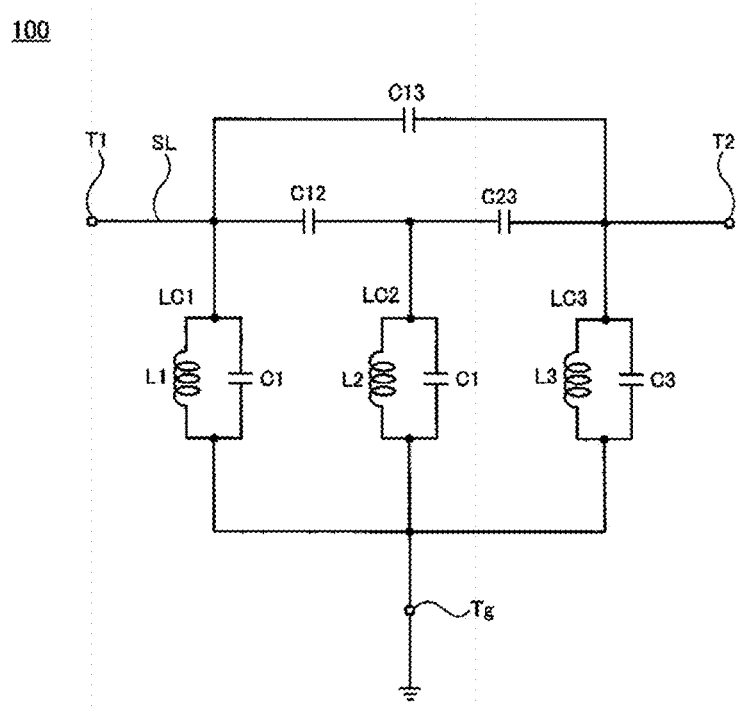
FIG. 2 is an equivalent circuit diagram of the multilayer LC filter 100.
Figure 3:
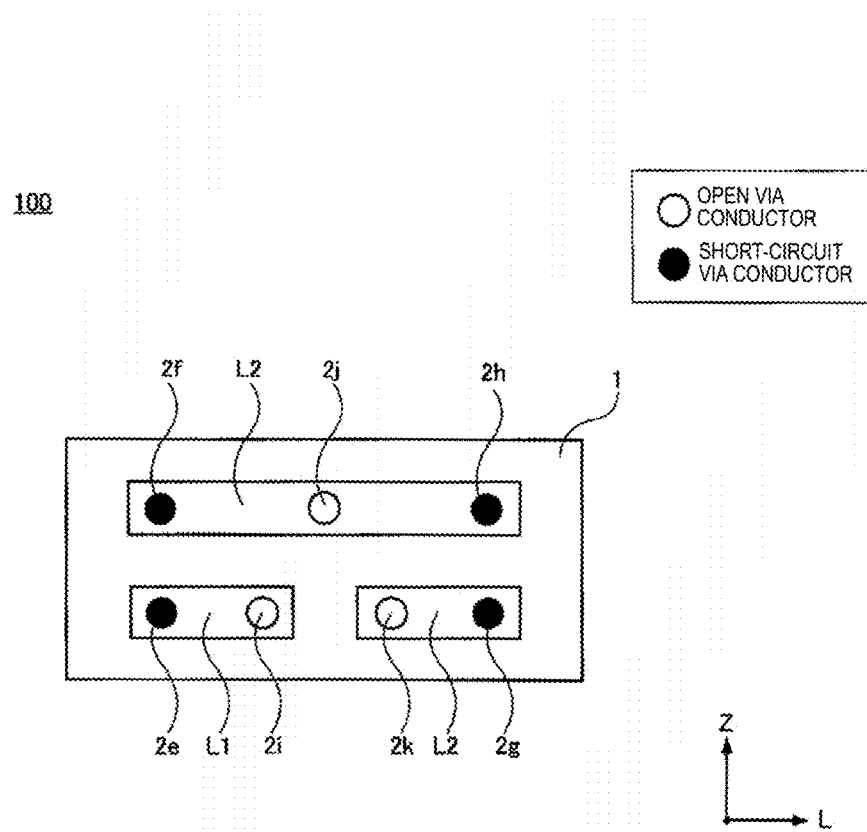
FIG. 3 is an explanatory view (perspective plan view) of the multilayer LC filter 100.

A multilayer LC filter 100 according to a first preferred embodiment is illustrated in FIG. 1, FIG. 2, and FIG. 3. FIG. 1 is an exploded perspective view of the multilayer LC filter 100. FIG. 2 is an equivalent circuit diagram of the multilayer LC filter 100. FIG. 3 is an explanatory view (perspective plan view) of the multilayer LC filter 100.

The multilayer LC filter 100 is a band pass filter. However, multilayer LC filters according to preferred embodiments of the present invention are not limited to the band pass filter and may be a low pass filter, a high pass filter, or the like.

The multilayer LC filter 100 includes a multilayer body 1.

The multilayer body 1 has a height direction Z in which dielectric layers 1a to 1g to be described later are laminated, a width direction W orthogonal to the height direction Z, and a length direction L orthogonal to both the height direction Z and the width direction W. In the present preferred embodiment, when a length in the width direction W is a and a length in the length direction L is b, a<b is satisfied, but instead, a=b may be satisfied.

The multilayer body 1 includes the dielectric layers 1a to 1g laminated in order from the bottom. Although thicknesses of the dielectric layers 1a to 1g are illustrated to be uniform in FIG. 1, there may actually be a difference in the thicknesses. In the case above, a dielectric layer having a small thickness includes a single dielectric sheet, and a dielectric layer having a large thickness includes multiple dielectric sheets, for example. Any material may be used for the multilayer body 1 (dielectric layers 1a to 1g), and various dielectric materials may be used.

Hereinafter, each configuration of the dielectric layers 1a to 1g will be described.

A first input/output terminal T1, a second input/output terminal T2, two ground terminals Tg, and two dummy terminals Td are provided on a lower main surface of the dielectric layer 1a. The dummy terminal Td is an electrode that is not used for electrical connection when the multilayer LC filter 100 is mounted on a substrate or the like, but is dedicatedly used to increase mounting strength. In FIG. 1, the input/output terminals T1 and T2, the ground terminals Tg, and the dummy terminals Td are illustrated away from the lower main surface of the dielectric layer 1a for the sake of illustration.

Via conductors 2a, 2b, 2c, and 2d penetrate through the dielectric layer 1a between an upper main surface and the lower main surface thereof.

A ground conductor pattern 3 is provided on the upper main surface of the dielectric layer 1a. The ground conductor pattern 3 is connected to each of the two ground terminals Tg by the two via conductors 2b and 2c.

In addition to the above-described via conductors 2a and 2d, additional via conductors 2e, 2f, 2g, and 2h penetrate through the dielectric layer 1b between an upper main surface and a lower main surface thereof.

A jump-coupling capacitor conductor pattern 4a is provided on the upper main surface of the dielectric layer 1a.

The above-described via conductors 2a, 2d, 2e, 2f, 2g, and 2h penetrate through the dielectric layer 1c between an upper main surface and a lower main surface thereof.

Three capacitor conductor patterns 5a, 5b, and 5c are provided on the upper main surface of the dielectric layer 1c. The capacitor conductor pattern 5a is connected to the first input/output terminal T1 by the via conductor 2a. The capacitor conductor pattern 5c is connected to the second input/output terminal T2 by the via conductor 2d.

In addition to the above-described via conductors 2e, 2f, 2g, and 2h, additional via conductors 2i, 2j, and 2k penetrate through the dielectric layer 1d between an upper main surface and a lower main surface thereof.

Coupling capacitor conductor patterns 6a and 6b are provided on the upper main surface of the dielectric layer 1d.

The above-described via conductors 2e, 2f, 2g, 2h, 2i, 2j, and 2k penetrate through the dielectric layer 1e between an upper main surface and a lower main surface thereof.

Line-shaped conductor patterns 7a, 7b, and 7c are provided on the upper main surface of the dielectric layer 1e. One end of the line-shaped conductor pattern 7a is connected to the ground conductor pattern 3 by the via conductor 2e. The other end of the line-shaped conductor pattern 7a is connected to the capacitor conductor pattern 5a by the via conductor 2i. One end of the line-shaped conductor pattern 7b is connected to the ground conductor pattern 3 by the via conductor 2f. The other end of the line-shaped conductor pattern 7b is connected to the ground conductor pattern 3 by the via conductor 2h. A portion in the vicinity of a center of the line-shaped conductor pattern 7b is connected to the capacitor conductor pattern 5b by the via conductor 2j. One end of the line-shaped conductor pattern 7c is connected to the ground conductor pattern 3 by the via conductor 2g. The other end of the line-shaped conductor pattern 7c is connected to the capacitor conductor pattern 5c by the via conductor 2k.

The above-described via conductors 2e, 2f, 2g, 2h, 2i, 2j, and 2k penetrate through the dielectric layer 1f between an upper main surface and a lower main surface thereof.

Line-shaped conductor patterns 7d, 7e, and 7f are provided on the upper main surface of the dielectric layer 1f.

The line-shaped conductor patterns 7d, 7e, and 7f vertically overlap with the above-described line-shaped conductor patterns 7a, 7b, and 7c, respectively. That is, in the multilayer LC filter 100, the line-shaped conductor patterns overlap with each other in two layers in order to increase a Q of an inductor. Note that the line-shaped conductor patterns 7d, 7e, and 7f may be omitted in terms of an electric circuit.

One end of the line-shaped conductor pattern 7d is connected to the ground conductor pattern 3 by the via conductor 2e. The other end of the line-shaped conductor pattern 7d is connected to the capacitor conductor pattern 5a by the via conductor 2i. One end of the line-shaped conductor pattern 7e is connected to the ground conductor pattern 3 by the via conductor 2f. The other end of the line-shaped conductor pattern 7e is connected to the ground conductor pattern 3 by the via conductor 2h. A portion in the vicinity of a center of the line-shaped conductor pattern 7e is connected to the capacitor conductor pattern 5b by the via conductor 2j. One end of the line-shaped conductor pattern 7f is connected to the ground conductor pattern 3 by the via conductor 2g. The other end of the line-shaped conductor pattern 7f is connected to the capacitor conductor pattern 5c by the via conductor 2k.

The dielectric layer 1g is a protection layer, and a via conductor or a conductor pattern is not provided thereon.

Any material may be used for the input/output terminals T1 and T2, the ground terminals Tg, the dummy terminals Td, the via conductors 2a to 2k, the ground conductor pattern 3, the jump-coupling capacitor conductor pattern 4a, the capacitor conductor patterns 5a to 5c, the coupling capacitor conductor patterns 6a and 6b, and the line-shaped conductor patterns 7a to 7f, and various conductive materials may be used.

The multilayer LC filter 100 has an equivalent circuit illustrated in FIG. 2.

The multilayer LC filter 100 includes the first input/output terminal T1 and the second input/output terminal T2. A signal line SL is provided between the first input/output terminal T1 and the second input/output terminal T2.

In the multilayer LC filter 100, a capacitor C12 and a capacitor C23 are connected in this order in the signal line SL connecting the first input/output terminal T1 and second input/output terminal T2. In the multilayer LC filter 100, a capacitor C13 is connected in parallel to the capacitor C12 and the capacitor C23 between the first input/output terminal T1 and second input/output terminal T2.

The multilayer LC filter 100 includes three first to third LC parallel resonators LC1, LC2, and LC3. The first LC parallel resonator LC1 is formed by connecting an inductor L1 and a capacitor C1 in parallel. The second LC parallel resonator LC2 is formed by connecting an inductor L2 and a capacitor C2 in parallel. The third LC parallel resonator LC3 is formed by connecting an inductor L3 and a capacitor C3 in parallel.

One end of the first LC parallel resonator LC1 is connected to a portion of the signal line SL between the first input/output terminal T1 and the capacitor C12, and the other end of the first LC parallel resonator LC1 is connected to the ground terminal Tg. One end of the second LC parallel resonator LC2 is connected to a portion of the signal line SL between the capacitors C12 and C23, and the other end of the second LC parallel resonator LC2 is connected to the ground terminal Tg. One end of the third LC parallel resonator LC3 is connected to a portion of the signal line SL between the capacitor C23 and the second input/output terminal T2, and the other end of the third LC parallel resonator LC3 is connected to the ground terminal Tg.

Next, main coupling relationships of the first to third LC parallel resonators LC1, LC2, and LC3 will be described.

The first LC parallel resonator LC1 and the second LC parallel resonator LC2 are magnetically coupled with the magnetic coupling of the inductor L1 and the inductor L2. The second LC parallel resonator LC2 and the third LC parallel resonator LC3 are magnetically coupled with the magnetic coupling of the inductor L2 and the inductor L3.

The first LC parallel resonator LC1 and the second LC parallel resonator LC2 are capacitively coupled with the capacitance of the capacitor C12. The second LC parallel resonator LC2 and the third LC parallel resonator LC3 are capacitively coupled with the capacitance of the capacitor C23. The first LC parallel resonator LC1 and the third LC parallel resonator LC3 are coupled with jump-capacitive coupling with the capacitance of the capacitor C13.

With the above-described equivalent circuit and coupling, in the multilayer LC filter 100, a three stage band pass filter is provided between the first input/output terminal T1 and the second input/output terminal T2.

Next, the relationship between the equivalent circuit and the structure of the multilayer LC filter 100 will be described.

The capacitor C1 of the first LC parallel resonator LC1 includes the capacitance between the capacitor conductor pattern and the ground conductor pattern 3. The capacitor conductor pattern 5a is connected to the first input/output terminal T1 by the via conductor 2a. The inductor L1 of the via conductor first LC parallel resonator LC1 includes a loop inductor that starts from the capacitor conductor pattern 5a, passes through the via conductor 2i, the line-shaped conductor patterns 7a and 7d, and the via conductor 2e, and ends at the ground conductor pattern 3.

The capacitor C2 of the second LC parallel resonator LC2 includes the capacitance between the capacitor conductor pattern and the ground conductor pattern 3. The inductor L2 of the second LC parallel resonator LC2 includes a loop inductor that starts from the capacitor conductor pattern 5b, passes through the via conductor 2j, the line-shaped conductor patterns 7b and 7e, is further divided here into two paths, passes through the via conductor 2f and the via conductor 2h, and ends at the ground conductor pattern 3.

The capacitor C3 of the third LC parallel resonator LC3 includes the capacitance between the capacitor conductor pattern and the ground conductor pattern 3. The inductor L3 of the third LC parallel resonator LC3 includes a loop inductor that starts from the capacitor conductor pattern 5c, passes through the via conductor 2k, the line-shaped conductor patterns 7c and 7f, and the via conductor 2g, and ends at the ground conductor pattern 3. The capacitor conductor pattern 5c is connected to the second input/output terminal T2 by the via conductor 2d.

The capacitor C12 includes capacitance between the capacitor conductor pattern 5a and the coupling capacitor conductor pattern 6a, and capacitance between the coupling capacitor conductor pattern 6a and the capacitor conductor pattern which are connected in series.

The capacitor C23 includes capacitance between the capacitor conductor pattern 5b and the coupling capacitor conductor pattern 6b, and capacitance between the coupling capacitor conductor pattern 6b and the capacitor conductor pattern which are connected in series.

The capacitor C13 includes capacitance between the capacitor conductor pattern 5a and the jump-coupling capacitor conductor pattern 4a and capacitance between the jump-coupling capacitor conductor pattern 4a and the capacitor conductor pattern which are connected in series.

In the multilayer LC filter 100 having the above-described structure and equivalent circuit, when the multilayer body 1 is seen through in the height direction Z, open via conductors are disposed closer to a center in the length direction L of the multilayer body 1, and short-circuit via conductors are disposed closer to the outer side in the length direction L of the multilayer body 1, in all of the inductor L1 being the loop inductor of the first LC parallel resonator LC1, the inductor L2 being the loop inductor of the second LC parallel resonator LC2, and the inductor L3 being the loop inductor of the third LC parallel resonator LC3. Note that the open via conductor refers to a via conductor connected to a capacitor conductor pattern, and the short-circuit via conductor refers to a via conductor connected to a ground conductor pattern.

As described above, the inductor L1, being the loop inductor of the first LC parallel resonator LC1, includes a loop inductor that starts from the capacitor conductor pattern 5a, passes through the via conductor 2i, the line-shaped conductor patterns 7a and 7d, and the via conductor 2e, and ends at the ground conductor pattern 3. Among the elements above, the via conductor 2i is the open via conductor of the inductor L1. The via conductor 2e is the short-circuit via conductor of the inductor L1.

The inductor L2, being the loop inductor of the second LC parallel resonator LC2, includes a loop inductor that starts from the capacitor conductor pattern 5b, passes through the via conductor 2j, the line-shaped conductor patterns 7b and 7e, is further divided here into two paths, passes through the via conductor 2f and the via conductor 2h, and ends at the ground conductor pattern 3. Among the elements above, the via conductor 2j is the open via conductor of the inductor L2. The via conductors 2f and 2h are the short-circuit via conductors of the inductor L2.

The inductor L3, being the loop inductor of the third LC parallel resonator LC3, includes a loop inductor that starts from the capacitor conductor pattern 5c, passes through the via conductor 2k, the line-shaped conductor patterns 7c and 7f, and the via conductor 2g, and ends at the ground conductor pattern 3. Among the elements above, the via conductor 2k is the open via conductor of the inductor L3. The via conductor 2g is the short-circuit via conductor of the inductor L1.

The open via conductors and the short-circuit via conductors of the inductors L1 to L3 are illustrated in FIG. 3. As can be seen in FIG. 3, in the multilayer LC filter 100, in all the inductors L1, L2, and L3 of the first to third LC parallel resonators LC1, LC2, and LC3, the open via conductors are disposed closer to the center in the length direction L, and the short-circuit via conductors are disposed closer to the outer side in the length direction L. From another point of view, the open via conductor of the inductor L1 is disposed closer to the open via conductor of the inductor L2 than to the short-circuit via conductor of the inductor L2, and is disposed closer to the open via conductor of the inductor L3 than to the short-circuit via conductor of the inductor L3, and the open via conductor of the inductor L2 is disposed closer to the open via conductor of the inductor L3 than to the short-circuit via conductor of the inductor L3. As a result, the open via conductor is disposed closer to a center of the multilayer body 1. Furthermore, as a result, in the multilayer LC filter 100, the capacitor conductor patterns 5a, 5b, and 5c of the first to third LC parallel resonators LC1, LC2, and LC3 are also disposed closer to the center of the multilayer body 1. This is because the open via conductor is a via conductor connected to the capacitor conductor pattern.

Disposing the capacitor conductor pattern of the LC parallel resonators closer to the center of the multilayer body facilitates the jump-coupling (jump-capacitive coupling) of the LC parallel resonators separated from each other in the equivalent circuit. This is because, generally, the jump-capacitive coupling is implemented by inserting a capacitor between capacitor conductor patterns of two LC parallel resonators to provide jump-coupling. More specifically, jump-capacitive coupling may be implemented by providing a jump-coupling capacitor conductor pattern between the capacitor conductor patterns of two LC parallel resonators to provide jump-coupling.

In the multilayer LC filter 100, the first LC parallel resonator LC1 and the third LC parallel resonator LC3 are jump-coupled (jump-capacitive coupled) by providing the jump-coupling capacitor conductor pattern 4a. As a result, the multilayer LC filter 100 is adjusted to have a desired frequency characteristic (pass band characteristic).

Figure 4:
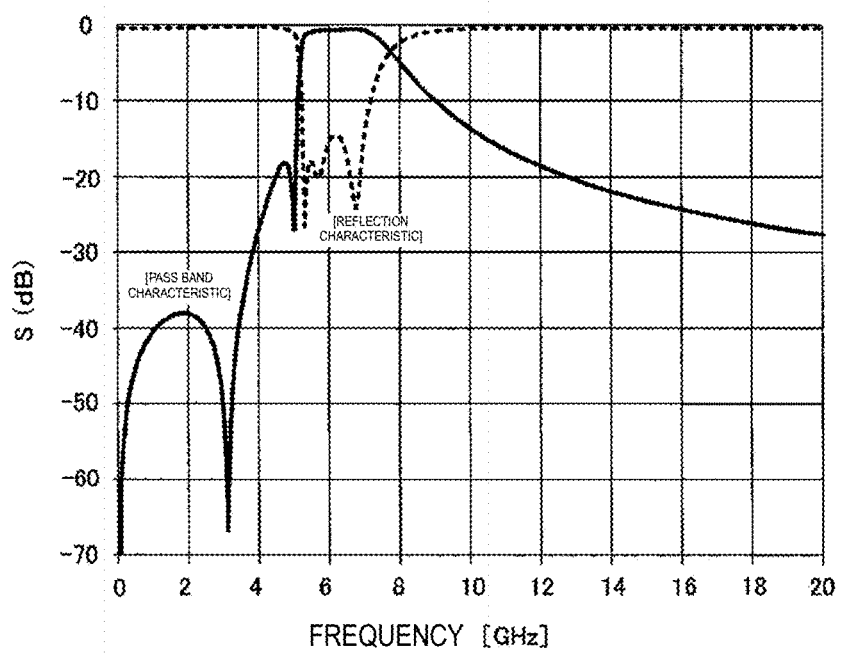
FIG. 4 is a graph illustrating a frequency characteristic of the multilayer LC filter 100.

A frequency characteristic of the multilayer LC filter 100 is described in FIG. 4. As can be seen in FIG. 4, two stage attenuation poles may easily be provided on a low frequency side by disposing each open via conductor of each LC parallel resonator closer to the center of the multilayer body 1. Although the two stage attenuation poles are provided on the low frequency side in FIG. 4, two stage attenuation poles may be provided on a high frequency side by adjusting capacitive coupling and magnetic coupling.

First Modification of First Preferred Embodiment: Multilayer LC Filter 110

Figure 5:
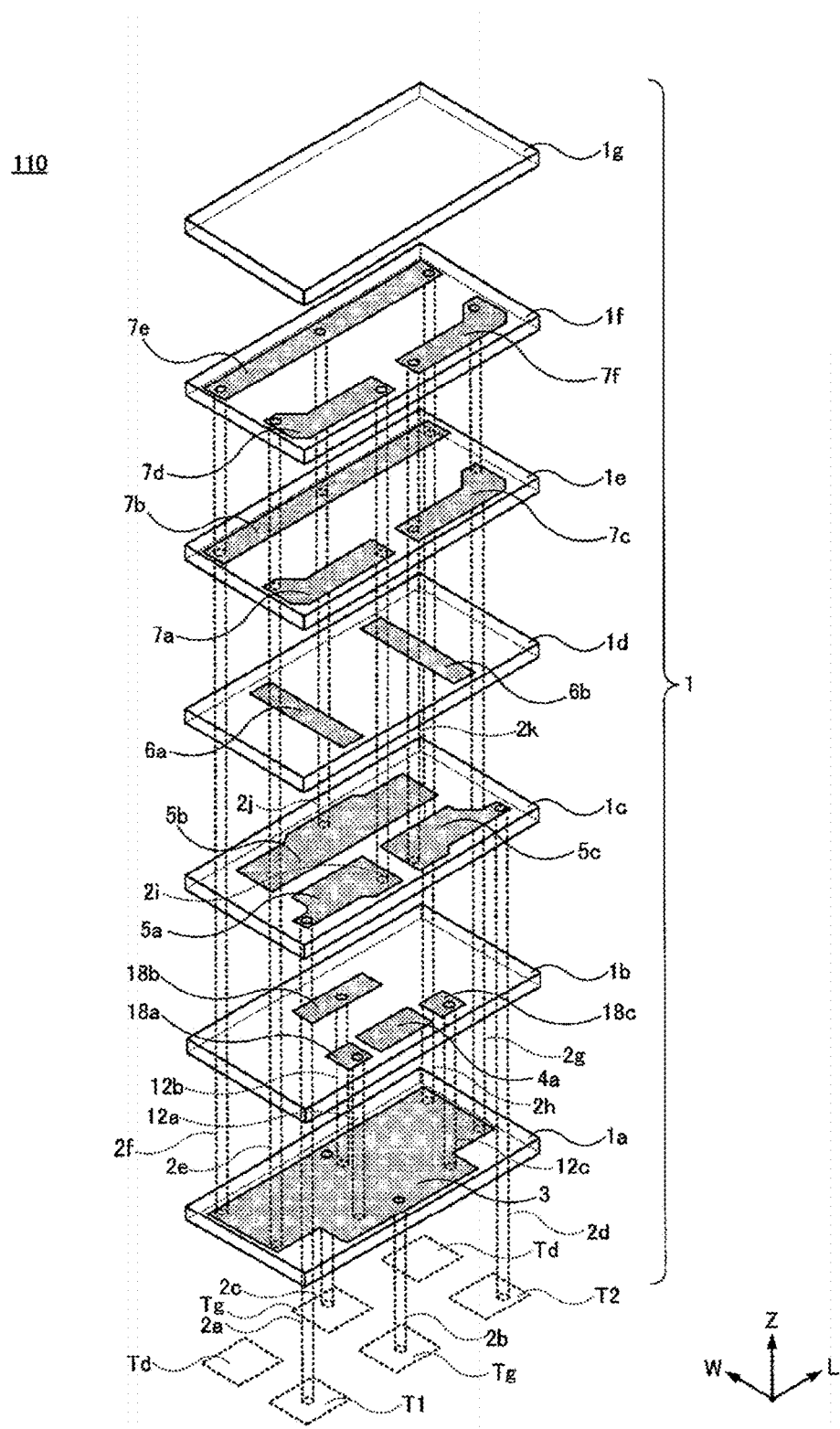
FIG. 5 is an exploded perspective view of a multilayer LC filter 110 according to a first modification of the multilayer LC filter 100.

A multilayer LC filter 110 according to a first modification of the first preferred embodiment is illustrated in FIG. 5. FIG. 5 is an exploded perspective view of the multilayer LC filter 110.

In the multilayer LC filter 110 according to the first modification, new elements are added to the above-described multilayer LC filter 100. Specifically, new via conductors 12a, 12b, and 12c penetrate through the dielectric layer 1b between the upper main surface and the lower main surface thereof. Three adjustment capacitor conductor patterns 18a, 18b, and 18c are provided on the upper main surface of the dielectric layer 1b. The adjustment capacitor conductor pattern 18a is connected to the ground conductor pattern 3 by the via conductor 12a. The adjustment capacitor conductor pattern 18b is connected to the ground conductor pattern 3 by the via conductor 12b. The adjustment capacitor conductor pattern 18c is connected to the ground conductor pattern 3 by the via conductor 12c.

The adjustment capacitor conductor pattern 18a increases the capacitance of the capacitor C1 between the capacitor conductor pattern 5a and the ground conductor pattern 3. The adjustment capacitor conductor pattern 18b increases the capacitance of the capacitor C2 between the capacitor conductor pattern 5b and the ground conductor pattern 3. The adjustment capacitor conductor pattern 18c increases the capacitance of the capacitor C3 between the capacitor conductor pattern 5c and the ground conductor pattern 3.

As described above, in the multilayer LC filter 110, the adjustment capacitor conductor patterns 18a, 18b, and 18c increase the capacitance of the capacitors C1, C2, and C3, thereby adjusting the frequency characteristic (pass band characteristic).

Note that the adjustment capacitor conductor pattern 18a may be connected to the capacitor conductor pattern 5a instead of being connected to the ground conductor pattern 3. The adjustment capacitor conductor pattern 18b may be connected to the capacitor conductor pattern 5b instead of being connected to the ground conductor pattern 3. The adjustment capacitor conductor pattern 18c may be connected to the capacitor conductor pattern 5c instead of being connected to the ground conductor pattern 3. In the case above as well, similarly, the capacitance of the capacitors C1, C2, and C3 may be increased to adjust the frequency characteristic.

In the multilayer LC filter 110, the adjustment capacitor conductor patterns 18a, 18b, and 18c are provided on the same dielectric layer as that of the jump-coupling capacitor conductor pattern 4a inside the multilayer body 1. Thus, in the multilayer LC filter 110, the frequency characteristic may be adjusted without increasing the size of the multilayer body 1 in the height direction Z.

Second Modification of First Preferred Embodiment: Multilayer LC Filter 120

Figure 6:
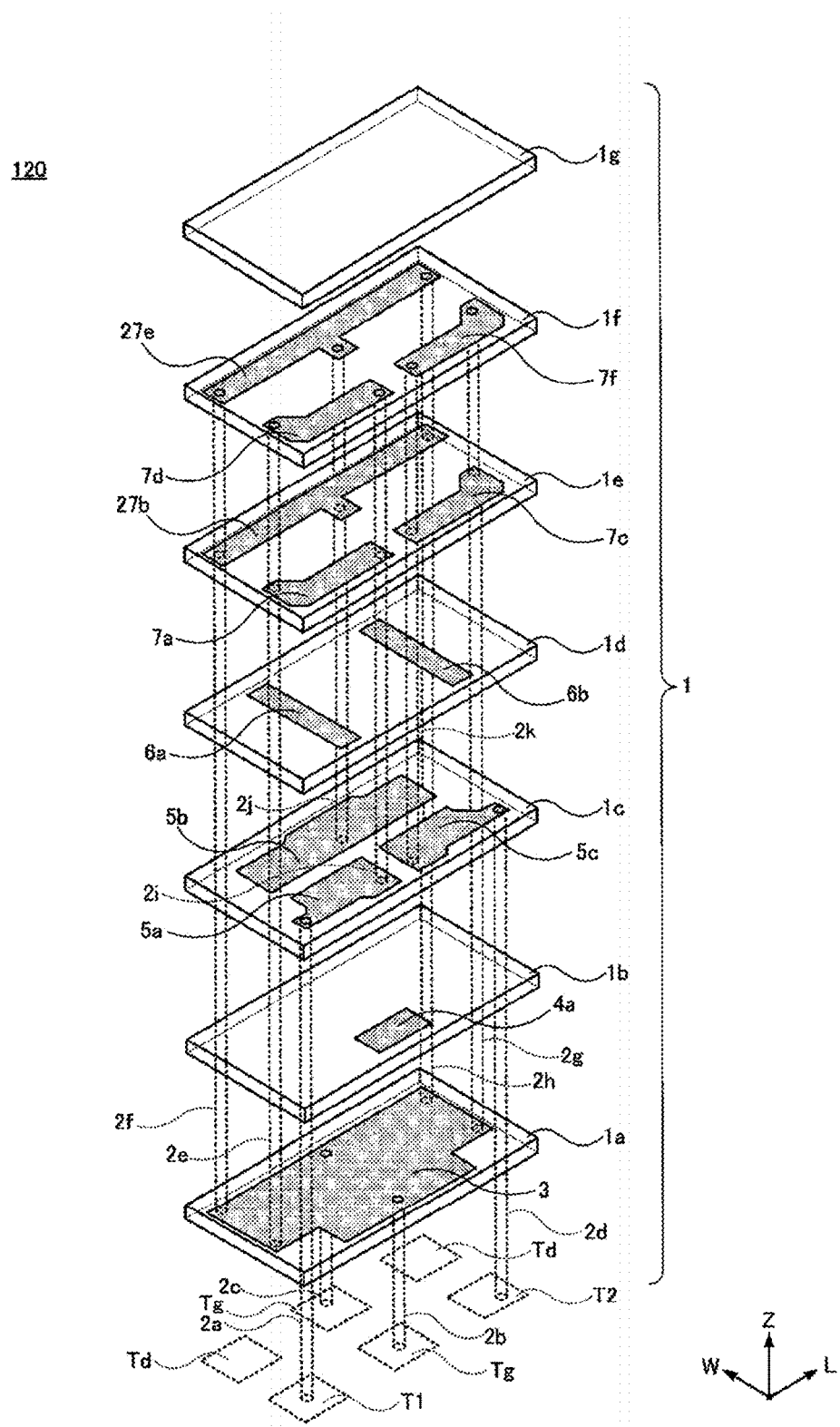
FIG. 6 is an exploded perspective view of a multilayer LC filter 120 according to a second modification of the multilayer LC filter 100.

A multilayer LC filter 120 according to a second modification of the first preferred embodiment is illustrated in FIG. 6. FIG. 6 is an exploded perspective view of the multilayer LC filter 120.

In the multilayer LC filter 120 according to the second modification, the configuration of the multilayer LC filter 100 described above is partially changed. Specifically, the shape of each of the line-shaped conductor patterns 7b and 7e is a linear shape in the configuration of the multilayer LC filter 100, but the shape is changed to a T-shape to provide line-shaped conductor patterns 27b and 27e. Accordingly, in the multilayer LC filter 120, the formation position of the via conductor 2j is moved toward the center of the multilayer body 1 in the width direction W.

As a result, in the multilayer LC filter 120, the open via conductor of the second LC parallel resonator is closer to the open via conductor of the first LC parallel resonator and the open via conductor of the third LC parallel resonator than in the multilayer LC filter 100. Therefore, the jump-coupling is strengthened. The jump-coupling of the first LC parallel resonator and the second LC parallel resonator and the jump-coupling of the second LC parallel resonator and the third LC parallel resonator may be adjusted by changing the position of the open via conductor of the second LC parallel resonator.

Third Modification of First Preferred Embodiment: Multilayer LC Filter 130

Figure 7:
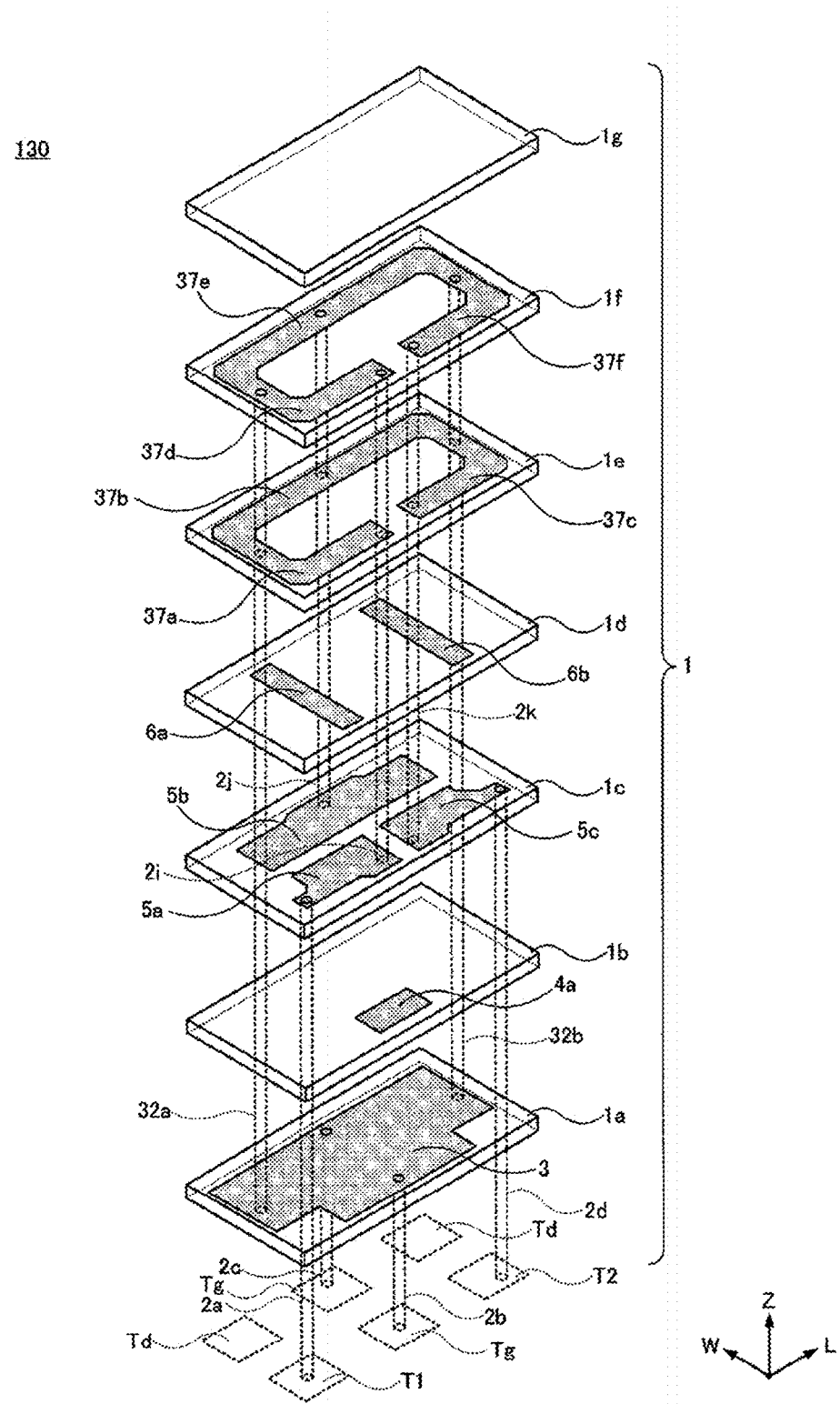
FIG. 7 is an exploded perspective view of a multilayer LC filter 130 according to a third modification of the multilayer LC filter 100.

A multilayer LC filter 130 according to a third modification of the first preferred embodiment is illustrated in FIG. 7. FIG. 7 is an exploded perspective view of the multilayer LC filter 130.

In the multilayer LC filter 130 according to the third modification, the configuration of the multilayer LC filter 100 described above is partially changed.

In the multilayer LC filter 100, the line-shaped conductor patterns 7a and 7d of the inductor L1 of the first LC parallel resonator LC1 and the line-shaped conductor patterns 7b and 7e of the inductor L2 of the second LC parallel resonator LC2 are independent of each other. The line-shaped conductor patterns 7a and 7d of the inductor L1 of the first LC parallel resonator LC1 are each connected to the ground conductor pattern 3 by the via conductor 2e, and the line-shaped conductor patterns 7b and 7e of the inductor L2 of the second LC parallel resonator LC2 are each connected to the ground conductor pattern 3 by the via conductor 2f. In the multilayer LC filter 130, the configuration described above is changed as follows. Line-shaped conductor patterns 37a and 37d of the inductor L1 of the first LC parallel resonator LC1 and line-shaped conductor patterns 37b and 37e of the inductor L2 of the second LC parallel resonator LC2 are connected to each other, and then connected to the ground conductor pattern 3 by a single common via conductor 32a.

In the multilayer LC filter 100, the line-shaped conductor patterns 7b and 7e of the inductor L2 of the second LC parallel resonator LC2 and the line-shaped conductor patterns 7c and 7f of the inductor L3 of the third LC parallel resonator LC3 are independent of each other. The line-shaped conductor patterns 7b and 7e of the inductor L2 of the second LC parallel resonator LC2 are each connected to the ground conductor pattern 3 by the via conductor 2h, and the line-shaped conductor patterns 7c and 7f of the inductor L3 of the third LC parallel resonator LC3 are each connected to the ground conductor pattern 3 by the via conductor 2g. In the multilayer LC filter 130, the configuration described above is changed as follows. The line-shaped conductor patterns 37b and 37e of the inductor L2 of the second LC parallel resonator LC2 and line-shaped conductor patterns 37c and 37f of the inductor L3 of the third LC parallel resonator LC3 are connected to each other, and then connected to the ground conductor pattern 3 by a single common via conductor 32b.

In the multilayer LC filter 130, the line-shaped conductor patterns 37a and 37d of the inductor L1 of the first LC parallel resonator LC1 and the line-shaped conductor patterns 37b and 37e of the inductor L2 of the second LC parallel resonator LC2 are connected to the ground conductor pattern 3 by the single common via conductor 32a. This results in the magnetic coupling of the first LC parallel resonator LC1 and the second LC parallel resonator LC2 being strengthened. In the multilayer LC filter 130, the line-shaped conductor patterns 37b and 37e of the inductor L2 of the second LC parallel resonator LC2 and the line-shaped conductor patterns 37c and 37f of the inductor L3 of the third LC parallel resonator LC3 are connected to the ground conductor pattern 3 by the single common via conductor 32b. This results in the magnetic coupling of the second LC parallel resonator LC2 and the third LC parallel resonator LC3 being strengthened.

As described above, the magnetic coupling between the two LC parallel resonators may be strengthened by being made common and connecting line-shaped conductor patterns of inductors of two LC parallel resonators adjacent to each other in the equivalent circuit to the ground conductor pattern 3 by a single common via conductor.

Second Preferred Embodiment: Multilayer LC Filter 200

Figure 8:
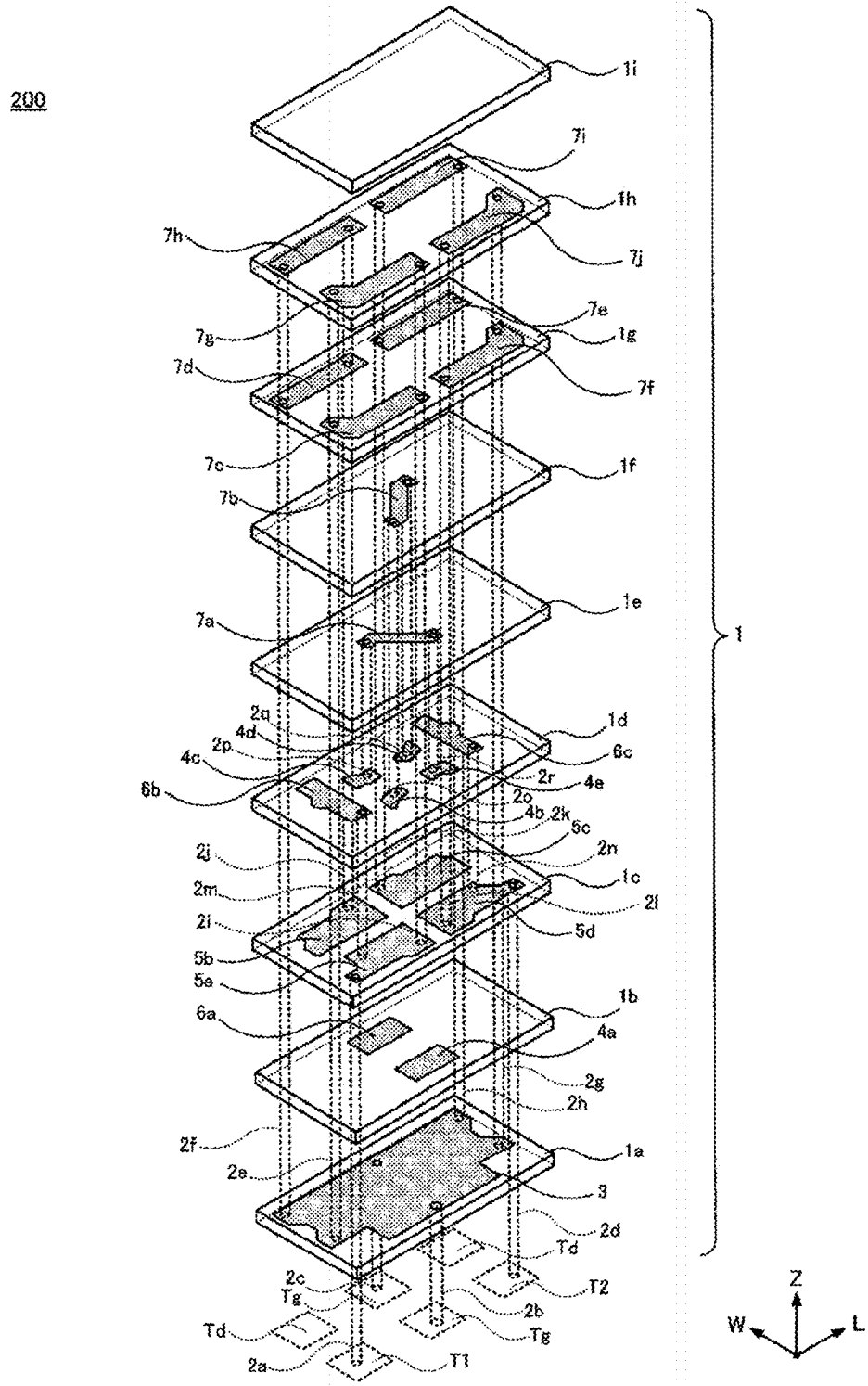
FIG. 8 is an exploded perspective view of a multilayer LC filter 200 according to a second preferred embodiment of the present invention.
Figure 9:
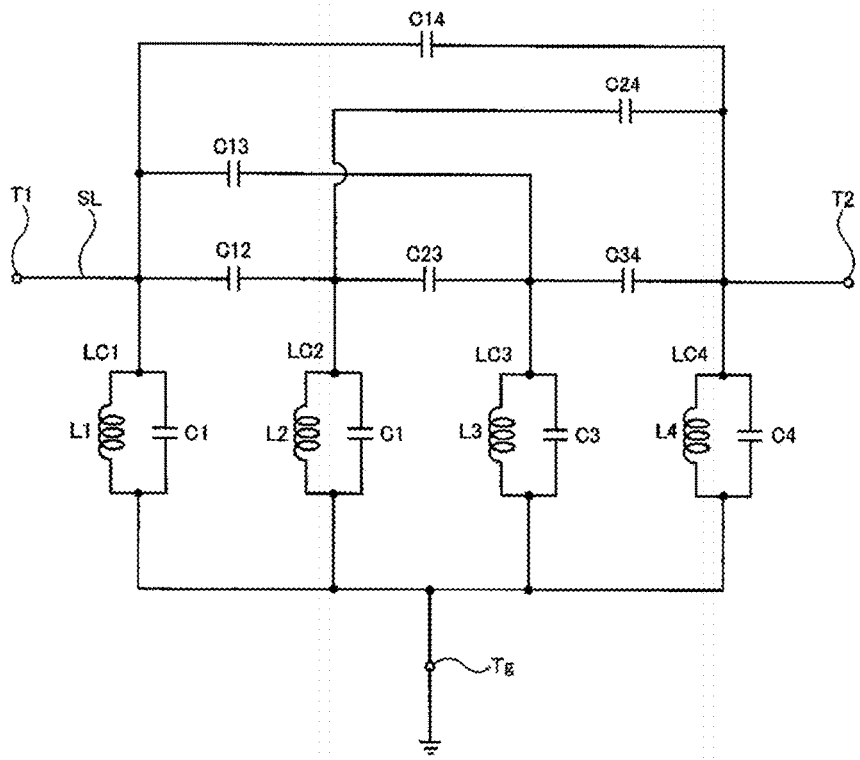
FIG. 9 is an equivalent circuit diagram of the multilayer LC filter 200.
Figure 10:
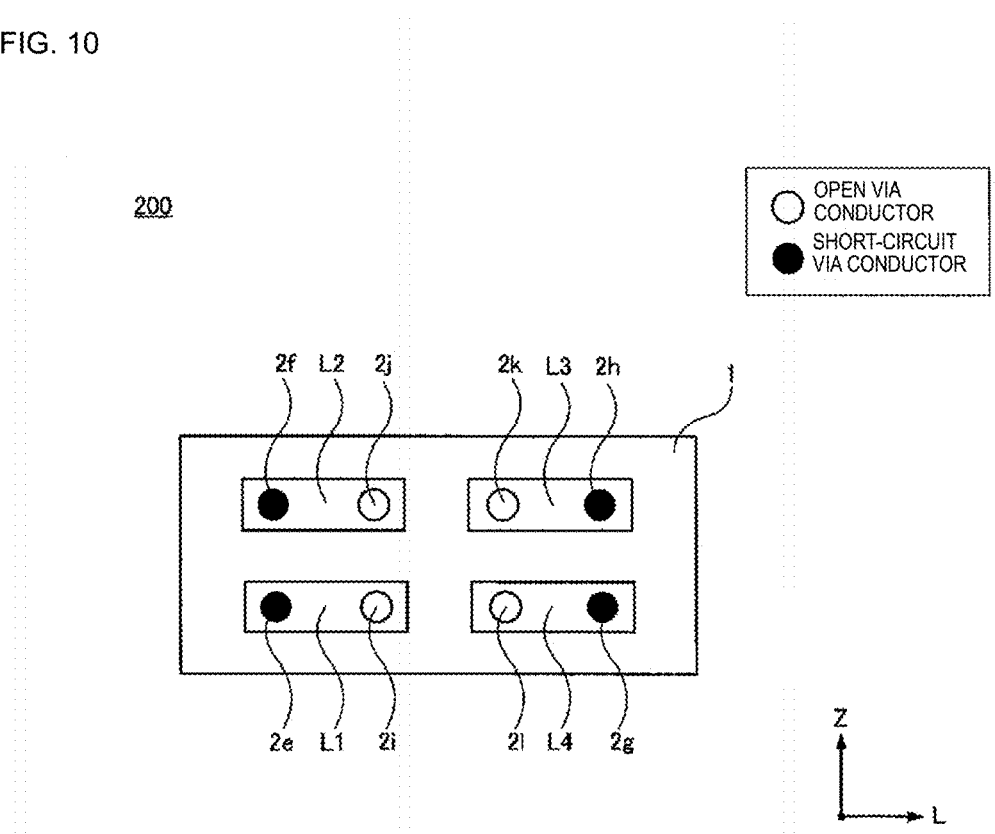
FIG. 10 is an explanatory view (perspective plan view) of the multilayer LC filter 200.

A multilayer LC filter 200 according to a second preferred embodiment is illustrated in FIG. 8, FIG. 9, and FIG. 10. FIG. 8 is an exploded perspective view of the multilayer LC filter 200. FIG. 9 is an equivalent circuit diagram of the multilayer LC filter 200. FIG. 10 is an explanatory view (perspective plan view) of the multilayer LC filter 200.

The multilayer LC filter 200 is a band pass filter.

The multilayer LC filter 200 includes a multilayer body 1.

The multilayer body 1 includes dielectric layers 1a to 1i laminated in order from the bottom. Hereinafter, each configuration of the dielectric layers 1a to 1g will be described.

A first input/output terminal T1, a second input/output terminal T2, two ground terminals Tg, and two dummy terminals Td are provided on a lower main surface of the dielectric layer 1a.

Via conductors 2a, 2b, 2c, and 2d penetrate through the dielectric layer 1a between an upper main surface and the lower main surface thereof.

The ground conductor pattern 3 is provided on the upper main surface of the dielectric layer 1a. The ground conductor pattern 3 is connected to each of the two ground terminals Tg by the two via conductors 2b and 2c.

In addition to the above-described via conductors 2a and 2d, new via conductors 2e, 2f, 2g, and 2h penetrate through the dielectric layer 1b between an upper main surface and a lower main surface thereof.

A jump-coupling capacitor conductor pattern 4a is provided on the upper main surface of the dielectric layer 1a. The coupling capacitor conductor pattern 6a is provided on the upper main surface of the dielectric layer 1a.

The above-described via conductors 2a, 2d, 2e, 2f, 2g, and 2h penetrate through the dielectric layer 1c between an upper main surface and a lower main surface thereof.

On the upper main surface of the dielectric layer 1c, four capacitor conductor patterns 5a, 5b, 5c, and 5d are provided. The capacitor conductor pattern 5a is connected to the first input/output terminal T1 by the via conductor 2a. The capacitor conductor pattern 5d is connected to the second input/output terminal T2 by the via conductor 2d.

In addition to the above-described via conductors 2e, 2f, 2g, and 2h, new via conductors 2i, 2j, 2k, 2l, 2m, and 2n penetrate through the dielectric layer 1d between an upper main surface and a lower main surface thereof.

The coupling capacitor conductor patterns 6b and 6c are provided on the upper main surface of the dielectric layer 1d. Further, jump-coupling capacitor conductor patterns 4b, 4c, 4d, and 4e are provided on the upper main surface of the dielectric layer 1d.

The coupling capacitor conductor pattern 6b is connected to the capacitor conductor pattern 5a by the via conductor 2m. The coupling capacitor conductor pattern 6c is connected to the capacitor conductor pattern 5d by the via conductor 2n.

In addition to the above-described via conductors 2e, 2f, 2g, 2h, 2i, 2j, 2k, and 2l, new via conductors 2o, 2p, 2q, and 2r penetrate through the dielectric layer 1e between an upper main surface and a lower main surface thereof.

A line-shaped conductor pattern 7a is provided on the upper main surface of the dielectric layer 1e. One end of the line-shaped conductor pattern 7a is connected to the jump-coupling capacitor conductor pattern 4c by the via conductor 2p. The other end of the line-shaped conductor pattern 7a is connected to the jump-coupling capacitor conductor pattern 4e by the via conductor 2r.

The above-described via conductors 2e, 2f, 2g, 2h, 2i, 2j, 2k, 2l, 2o, and 2q penetrate through the dielectric layer 1f between an upper main surface and a lower main surface thereof.

A line-shaped conductor pattern 7b is provided on the upper main surface of the dielectric layer 1f. One end of the line-shaped conductor pattern 7b is connected to the jump-coupling capacitor conductor pattern 4b by the via conductor 2o. The other end of the line-shaped conductor pattern 7b is connected to the jump-coupling capacitor conductor pattern 4d by the via conductor 2q.

The above-described via conductors 2e, 2f, 2g, 2h, 2i, 2j, 2k, and 2l penetrate through the dielectric layer 1g between an upper main surface and a lower main surface thereof.

Line-shaped conductor patterns 7c, 7d, 7e, and 7f are provided on the upper main surface of the dielectric layer 1g. One end of the line-shaped conductor pattern 7c is connected to the ground conductor pattern 3 by the via conductor 2e. The other end of the line-shaped conductor pattern 7c is connected to the capacitor conductor pattern 5a by the via conductor 2i. One end of the line-shaped conductor pattern 7d is connected to the ground conductor pattern 3 by the via conductor 2f. The other end of the line-shaped conductor pattern 7d is connected to the capacitor conductor pattern 5b by the via conductor 2j. One end of the line-shaped conductor pattern 7e is connected to the ground conductor pattern 3 by the via conductor 2h. The other end of the line-shaped conductor pattern 7e is connected to the capacitor conductor pattern 5c by the via conductor 2k. One end of the line-shaped conductor pattern 7f is connected to the ground conductor pattern 3 by the via conductor 2g. The other end of the line-shaped conductor pattern 7f is connected to the capacitor conductor pattern 5d by the via conductor 2l.

The above-described via conductors 2e, 2f, 2g, 2h, 2i, 2j, 2k, and 2l penetrate through the dielectric layer 1h between an upper main surface and a lower main surface thereof.

Line-shaped conductor patterns 7g, 7h, 7i, and 7j are provided on the upper main surface of the dielectric layer 1g. One end of the line-shaped conductor pattern 7g is connected to the ground conductor pattern 3 by the via conductor 2e. The other end of the line-shaped conductor pattern 7g is connected to the capacitor conductor pattern 5a by the via conductor 2i. One end of the line-shaped conductor pattern 7h is connected to the ground conductor pattern 3 by the via conductor 2f. The other end of the line-shaped conductor pattern 7h is connected to the capacitor conductor pattern 5b by the via conductor 2j. One end of the line-shaped conductor pattern 7i is connected to the ground conductor pattern 3 by the via conductor 2h. The other end of the line-shaped conductor pattern 7i is connected to the capacitor conductor pattern 5c by the via conductor 2k. One end of the line-shaped conductor pattern 7j is connected to the ground conductor pattern 3 by the via conductor 2g. The other end of the line-shaped conductor pattern 7j is connected to the capacitor conductor pattern 5d by the via conductor 2l.

The dielectric layer 1h is a protection layer and via conductors or conductor patterns are not provided thereon.

The multilayer LC filter 200 has an equivalent circuit illustrated in FIG. 9.

The multilayer LC filter 200 includes the first input/output terminal T1 and the second input/output terminal T2. A signal line SL is located between the first input/output terminal T1 and the second input/output terminal T2.

In the multilayer LC filter 200, the capacitor C12, the capacitor C23, and a capacitor C34 are sequentially connected to the signal line SL connecting the first input/output terminal T1 and the second input/output terminal T2. In the multilayer LC filter 200, a capacitor C14 is connected between the first LC parallel resonator LC1 and a fourth LC parallel resonator LC4, which will be described below. The capacitor C13 is connected between the first LC parallel resonator LC1 and a third LC parallel resonator LC3. The capacitor C14 is connected between the second LC parallel resonator LC2 and the fourth LC parallel resonator LC4.

The multilayer LC filter 100 includes the four first to fourth LC parallel resonators LC1, LC2, LC3, and LC4. The first LC parallel resonator LC1 is formed by connecting the inductor L1 and the capacitor C1 in parallel. The second LC parallel resonator LC2 is formed by connecting the inductor L2 and the capacitor C2 in parallel. The third LC parallel resonator LC3 is formed by connecting the inductor L3 and the capacitor C3 in parallel. The fourth LC parallel resonator LC4 is formed by connecting an inductor L4 and a capacitor C4 in parallel.

One end of the first LC parallel resonator LC1 is connected to a portion of the signal line SL between the first input/output terminal T1 and the capacitor C12, and the other end of the first LC parallel resonator LC1 is connected to the ground terminal Tg. One end of the second LC parallel resonator LC2 is connected to a portion of the signal line SL between the capacitors C12 and C23, and the other end of the second LC parallel resonator LC2 is connected to the ground terminal Tg. One end of the third LC parallel resonator LC3 is connected to a portion of the signal line SL between the capacitors C23 and C34, and the other end of the third LC parallel resonator LC3 is connected to the ground terminal Tg. One end of the fourth LC parallel resonator LC4 is connected to a portion of the signal line SL between the capacitor C34 and the second input/output terminal T2, and the other end of the fourth LC parallel resonator LC4 is connected to the ground terminal Tg.

Next, main coupling relationships of the first to third LC parallel resonators LC1, LC2, and LC3 will be described.

The first LC parallel resonator LC1 and the second LC parallel resonator LC2 are magnetically coupled with the magnetic coupling of the inductor L1 and the inductor L2. The third LC parallel resonator LC3 and the fourth LC parallel resonator LC4 are magnetically coupled with the magnetic coupling of the inductor L3 and the inductor L4.

The first LC parallel resonator LC1 and the second LC parallel resonator LC2 are capacitively coupled with the capacitance of the capacitor C12. The second LC parallel resonator LC2 and the third LC parallel resonator LC3 are capacitively coupled with the capacitance of the capacitor C23. The third LC parallel resonator LC3 and the fourth LC parallel resonator LC4 are capacitively coupled with the capacitance of the capacitor C34.

The first LC parallel resonator LC1 and the fourth LC parallel resonator LC4 are jump-capacitive coupled with the capacitance of the capacitor C14. The first LC parallel resonator LC1 and the third LC parallel resonator LC3 are jump-capacitive coupled with the capacitance of the capacitor C13. The second LC parallel resonator LC1 and the fourth LC parallel resonator LC4 are jump-capacitive coupled with the capacitance of the capacitor C23.

With the above-described equivalent circuit and coupling, in the multilayer LC filter 200, a four stage band pass filter is configured between the first input/output terminal T1 and the second input/output terminal T2.

Next, the relationship between the equivalent circuit and the structure of the multilayer LC filter 200 will be described.

The capacitor C1 of the first LC parallel resonator LC1 includes the capacitance between the capacitor conductor pattern and the ground conductor pattern 3. The capacitor conductor pattern 5a is connected to the first input/output terminal T1 by the via conductor 2a. The inductor L1 of the via conductor first LC parallel resonator LC1 includes a loop inductor that starts from the capacitor conductor pattern 5a, passes through the via conductor 2i, the line-shaped conductor patterns 7c and 7d, and the via conductor 2e, and ends at the ground conductor pattern 3.

The capacitor C2 of the second LC parallel resonator LC2 includes the capacitance between the capacitor conductor pattern and the ground conductor pattern 3. The inductor L2 of the via conductor second LC parallel resonator LC2 includes a loop inductor that starts from the capacitor conductor pattern 5b, passes through the via conductor 2j, the line-shaped conductor patterns 7d and 7h, and the via conductor 2f, and ends at the ground conductor pattern 3.

The capacitor C3 of the third LC parallel resonator LC3 includes the capacitance between the capacitor conductor pattern and the ground conductor pattern 3. The inductor L3 of the via conductor third LC parallel resonator LC3 includes a loop inductor that starts from the capacitor conductor pattern 5c, passes through the via conductor 2k, the line-shaped conductor patterns 7e and 7i, and the via conductor 2h, and ends at the ground conductor pattern 3.

The capacitor C4 of the fourth LC parallel resonator LC4 includes the capacitance between the capacitor conductor pattern and the ground conductor pattern 3. The inductor L4 of the fourth LC parallel resonator LC4 includes a loop inductor that starts from the capacitor conductor pattern 5d, passes through the via conductor 2l, the line-shaped conductor patterns 7f and 7j, and the via conductor 2g, and ends at the ground conductor pattern 3. The capacitor conductor pattern 5d is connected to the second input/output terminal T2 by the via conductor 2d.

The capacitor C12 includes capacitance between the coupling capacitor conductor pattern 6b and the capacitor conductor pattern 5b. The coupling capacitor conductor pattern 6b is connected to the capacitor conductor pattern 5a by the via conductor 2m.

The capacitor C23 includes capacitance between the capacitor conductor pattern 5b and the coupling capacitor conductor pattern 6a, and capacitance between the coupling capacitor conductor pattern 6a and the capacitor conductor pattern which are connected in series.

The capacitor C34 includes capacitance between the capacitor conductor pattern 5b and the coupling capacitor conductor pattern 6c. The coupling capacitor conductor pattern 6c is connected to the capacitor conductor pattern 5d by the via conductor 2n.

The capacitor C14 includes capacitance between the capacitor conductor pattern 5a and the jump-coupling capacitor conductor pattern 4a, and capacitance between the jump-coupling capacitor conductor pattern 4a and the capacitor conductor pattern which are connected in series.

The capacitor C13 includes capacitance between the capacitor conductor pattern 5a and the jump-coupling capacitor conductor pattern 4b, and capacitance between the jump-coupling capacitor conductor pattern 4d and the capacitor conductor pattern which are connected in series. The jump-coupling capacitor conductor pattern 4b and the jump-coupling capacitor conductor pattern 4d are connected through the via conductor 2o, the line-shaped conductor pattern 7b, and the via conductor 2q.

A capacitor C24 includes capacitance between the capacitor conductor pattern 5b and the jump-coupling capacitor conductor pattern 4c, and capacitance between the jump-coupling capacitor conductor pattern 4e and the capacitor conductor pattern which are connected in series. The jump-coupling capacitor conductor pattern 4c and the jump-coupling capacitor conductor pattern 4e are connected through the via conductor 2p, the line-shaped conductor pattern 7a, and the via conductor 2r.

The open via conductors and the short-circuit via conductors of the inductors L1 to L4 are illustrated in FIG. 10. As can be seen in FIG. 10, in the multilayer LC filter 200, in all the inductors L1, L2, L3, and L4 of the first to fourth LC parallel resonators LC1, LC2, LC3, and LC4, the open via conductors are disposed closer to the center in the length direction L, and the short-circuit via conductors are disposed closer to the outer side in the length direction L. As a result, all the open via conductors are disposed closer to the center of the multilayer body 1.

In the multilayer LC filter 200, all the open via conductors are disposed closer to the center of the multilayer body 1. This facilitates the jump-coupling (jump-capacitive coupling) of the LC parallel resonators separated from each other in the equivalent circuit. Specifically, it is possible to easily form the capacitor C14, the capacitor C13, and the capacitor C24 which are used for the jump-capacitive coupling.

Figure 11:
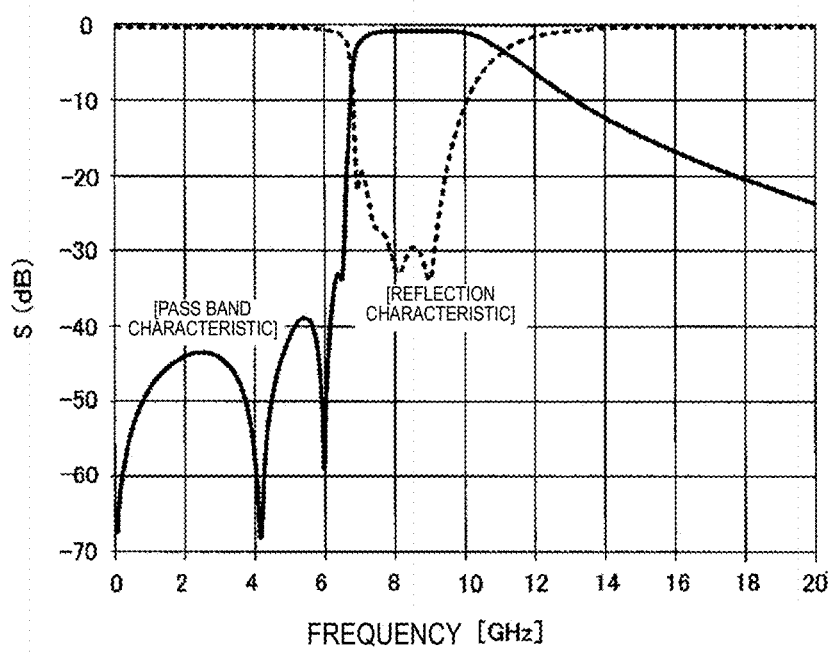
FIG. 11 is a graph illustrating a frequency characteristic of the multilayer LC filter 200.

A frequency characteristic of the multilayer LC filter 200 is described in FIG. 11. As can be seen in FIG. 11, three stage attenuation poles may easily be provided on a low frequency side by disposing each open via conductor of each LC parallel resonator closer to the center of the multilayer body 1. Although the three stage attenuation poles are provided on the low frequency side in FIG. 11, three stage attenuation poles may be provided on a high frequency side by adjusting the capacitive coupling and magnetic coupling.

First Modification of Second Preferred Embodiment: Multilayer LC Filter 210

Figure 12:
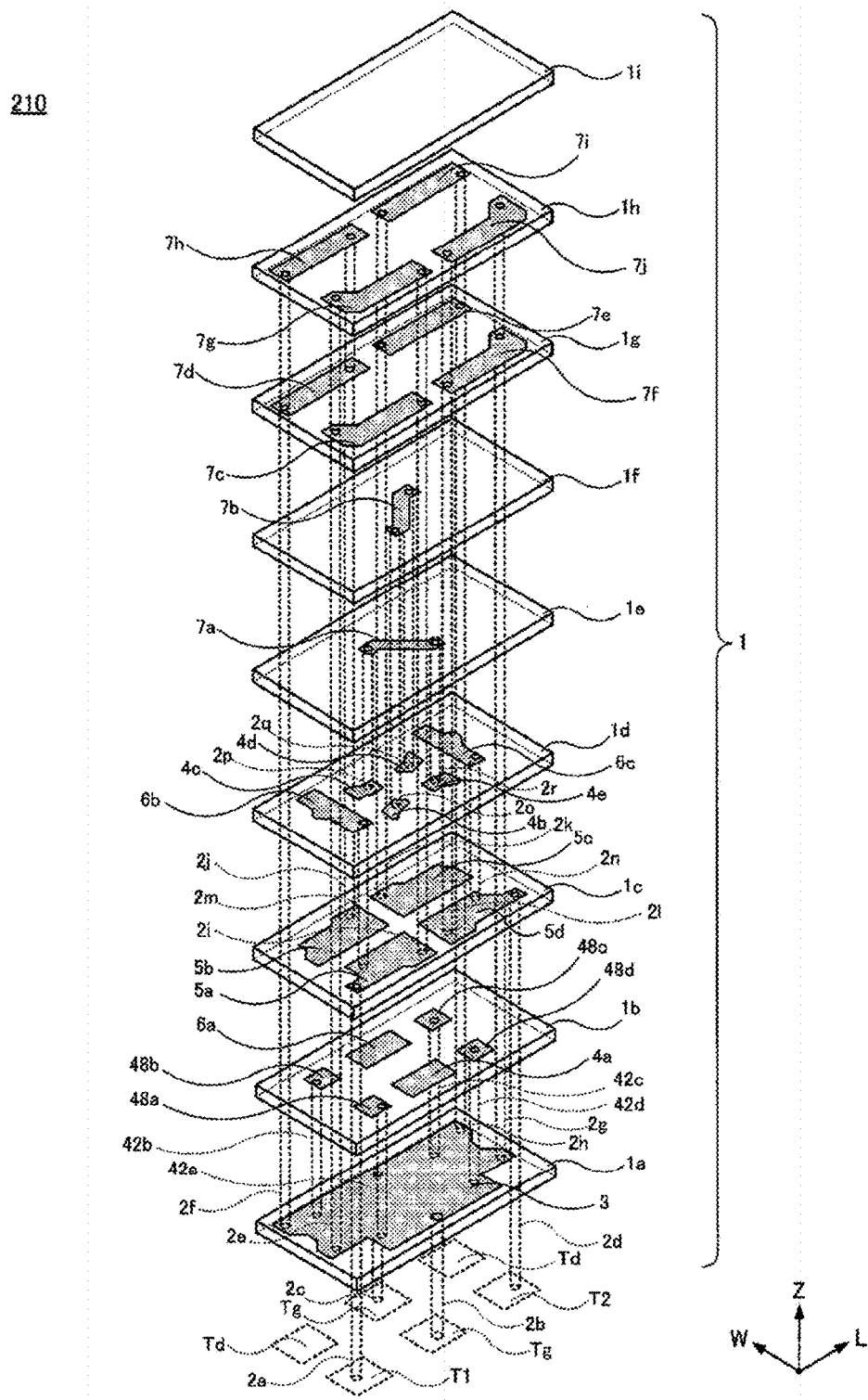
FIG. 12 is an exploded perspective view of a multilayer LC filter 210 according to a first modification of the multilayer LC filter 200.

A multilayer LC filter 210 according to a first modification of the second preferred embodiment is illustrated in FIG. 12. FIG. 12 is an exploded perspective view of the multilayer LC filter 210.

In the multilayer LC filter 210 according to the first modification, new elements are added to the above-described multilayer LC filter 200. Specifically, new via conductors 42a, 42b, 42c, and 42d were formed to penetrate through the dielectric layer 1b between the upper main surface and the lower main surface thereof. Four adjustment capacitor conductor patterns 48a, 48b, 48c, and 48d are provided on the upper main surface of the dielectric layer 1b. The adjustment capacitor conductor pattern 48a is connected to the ground conductor pattern 3 by the via conductor 42a. The adjustment capacitor conductor pattern 48b is connected to the ground conductor pattern 3 by the via conductor 42b. The adjustment capacitor conductor pattern 48c is connected to the ground conductor pattern 3 by the via conductor 42c. The adjustment capacitor conductor pattern 48d is connected to the ground conductor pattern 3 by the via conductor 42d.

The adjustment capacitor conductor pattern 48a increases the capacitance of the capacitor C1 between the capacitor conductor pattern 5a and the ground conductor pattern 3. The adjustment capacitor conductor pattern 48b increases the capacitance of the capacitor C2 between the capacitor conductor pattern 5b and the ground conductor pattern 3. The adjustment capacitor conductor pattern 48c increases the capacitance of the capacitor C3 between the capacitor conductor pattern 5c and the ground conductor pattern 3. The adjustment capacitor conductor pattern 48d increases the capacitance of the capacitor C4 between the capacitor conductor pattern 5c and the ground conductor pattern 3.

As described above, in the multilayer LC filter 210, the adjustment capacitor conductor patterns 48a, 48b, 48c, and 48d increase the capacitance of the capacitors C1, C2, C3, and C4, thereby adjusting the frequency characteristic (pass band characteristic).

Second Modification of Second Preferred Embodiment: Multilayer LC Filter 220

Figure 13:
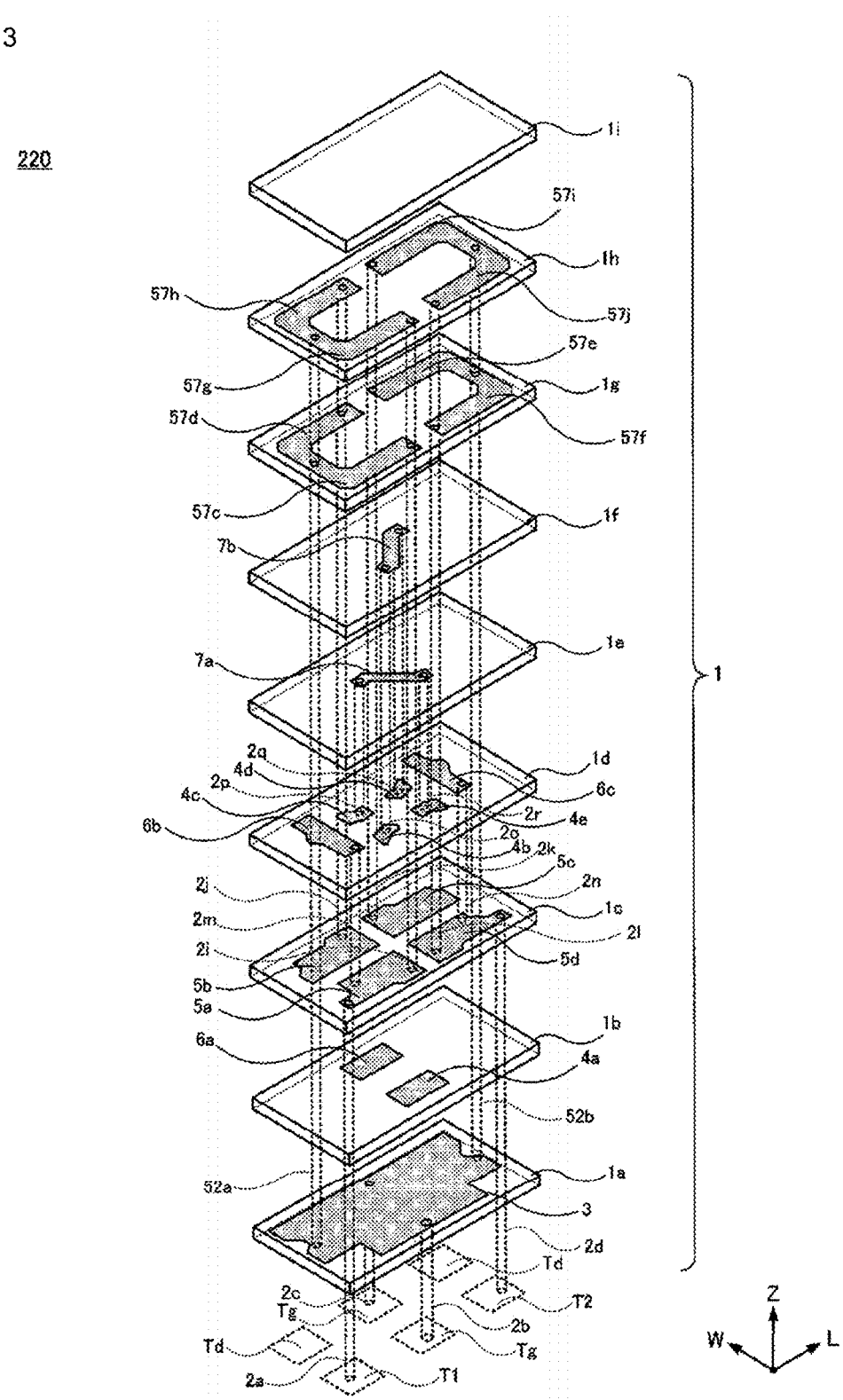
FIG. 13 is an exploded perspective view of a multilayer LC filter 220 according to a second modification of the multilayer LC filter 200.

A multilayer LC filter 220 according to a second modification of the second preferred embodiment is illustrated in FIG. 13. FIG. 13 is an exploded perspective view of the multilayer LC filter 220.

In the multilayer LC filter 220 according to a third modification, the configuration of the multilayer LC filter 200 described above is partially changed.

In the multilayer LC filter 200, the line-shaped conductor patterns 7c and 7g of the inductor L1 of the first LC parallel resonator LC1 and the line-shaped conductor patterns 7d and 7h of the inductor L2 of the second LC parallel resonator LC2 are independent of each other. The line-shaped conductor patterns 7c and 7g of the inductor L1 of the first LC parallel resonator LC1 are each connected to the ground conductor pattern 3 by the via conductor 2e, and the line-shaped conductor patterns 7d and 7h of the inductor L2 of the second LC parallel resonator LC2 are each connected to the ground conductor pattern 3 by the via conductor 2f. In the multilayer LC filter 220, the configuration described above is changed as follows. Line-shaped conductor patterns 57c and 57g of the inductor L1 of the first LC parallel resonator LC1 and line-shaped conductor patterns 57d and 57h of the inductor L2 of the second LC parallel resonator LC2 are connected to each other, and then connected to the ground conductor pattern 3 by a single common via conductor 52a.

In the multilayer LC filter 200, the line-shaped conductor patterns 7e and 7i of the inductor L3 of the third LC parallel resonator LC3 and the line-shaped conductor patterns 7f and 7j of the inductor L3 of the fourth LC parallel resonator LC3 are independent of each other. The line-shaped conductor patterns 7e and 7i of the inductor L3 of the third LC parallel resonator LC3 are each connected to the ground conductor pattern 3 by the via conductor 2h, and the line-shaped conductor patterns 7f and 7j of the inductor L4 of the fourth LC parallel resonator LC4 are each connected to the ground conductor pattern 3 by the via conductor 2g. In the multilayer LC filter 220, the configuration described above is changed as follows. The line-shaped conductor patterns 57e and 57i of the inductor L3 of the third LC parallel resonator LC3 and the line-shaped conductor patterns 57f and 57j of the inductor L4 of the fourth LC parallel resonator LC4 are connected to each other, and then connected to the ground conductor pattern 3 by a single common via conductor 52b.

In the multilayer LC filter 220, the line-shaped conductor patterns 57c and 57g of the inductor L1 of the first LC parallel resonator LC1 and the line-shaped conductor patterns 57d and 57h of the inductor L2 of the second LC parallel resonator LC2 are connected to the ground conductor pattern 3 by the single common via conductor 52a. This results in the magnetic coupling of the first LC parallel resonator LC1 and the second LC parallel resonator LC2 being strengthened. Further, in the multilayer LC filter 220, the line-shaped conductor patterns 57e and 57i of the inductor L3 of the third LC parallel resonator LC3 and the line-shaped conductor patterns 57f and 57j of the inductor L4 of the fourth LC parallel resonator LC4 are connected to the ground conductor pattern 3 by the single common via conductor 52b. This results in the magnetic coupling of the third LC parallel resonator LC3 and the fourth LC parallel resonator LC4 being strengthened.

Third Modification of Second Preferred Embodiment: Multilayer LC Filter 230

Figure 14:
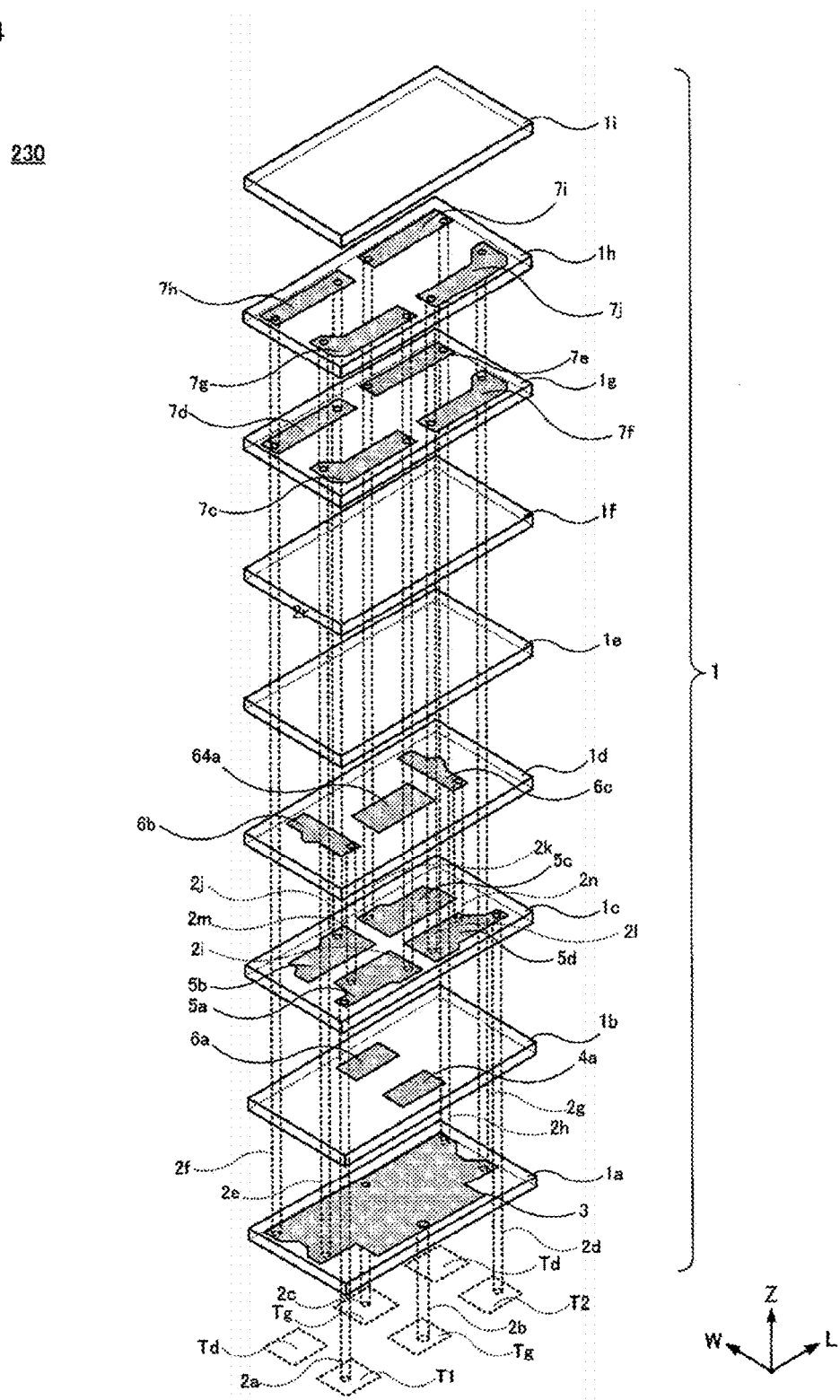
FIG. 14 is an exploded perspective view of a multilayer LC filter 230 according to a third modification of the multilayer LC filter 200.

A multilayer LC filter 230 according to a third modification of the second preferred embodiment is illustrated in FIG. 14. FIG. 14 is an exploded perspective view of the multilayer LC filter 230.

In the multilayer LC filter 230 according to the third modification, the configuration of the multilayer LC filter 200 described above is partially changed.

Specifically, in the multilayer LC filter 200, in order to form the jump-coupling capacitor C13, the jump-coupling capacitor conductor pattern 4b is formed to face the capacitor conductor pattern 5a, the jump-coupling capacitor conductor pattern 4d is formed to face the capacitor conductor pattern 5c, and the jump-coupling capacitor conductor pattern 4b and the jump-coupling capacitor conductor pattern 4d are connected by a path passing through the via conductor 2o, the line-shaped conductor pattern 7b, and the via conductor 2q. Further, in order to form a jump-coupling capacitor C24, the jump-coupling capacitor conductor pattern 4c is formed to face the capacitor conductor pattern 5b, the jump-coupling capacitor conductor pattern 4e is formed to face the capacitor conductor pattern 5d, and the jump-coupling capacitor conductor pattern 4c and the jump-coupling capacitor conductor pattern 4e are connected by a path passing through the via conductor 2p, the line-shaped conductor pattern 7a, and the via conductor 2r.

In the multilayer LC filter 230, the jump-coupling capacitor conductor patterns 4b, 4c, 4d, and 4e, the line-shaped conductor patterns 7a and 7b, and the via conductors 2o, 2p, 2q, and 2r are omitted, and instead, a single rectangular jump-coupling capacitor conductor pattern 64a is provided to face each of the capacitor conductor patterns 5a, 5b, 5c, and 5d.

In the multilayer LC filter 230, the jump-coupling capacitor C13 includes capacitance between the capacitor conductor pattern 5a and the jump-coupling capacitor conductor pattern 64a, and capacitance between the jump-coupling capacitor conductor pattern 64a and the capacitor conductor pattern 5c, which are connected in series. Further, the jump-coupling capacitor C24 includes capacitance between the capacitor conductor pattern 5b and the jump-coupling capacitor conductor pattern 64a, and capacitance between the jump-coupling capacitor conductor pattern 64a and the capacitor conductor pattern 5d, which are connected in series.

As described above, a jump-coupling capacitor conductor pattern may take various forms.

Third Preferred Embodiment: Multilayer LC Filter
300

Figure 15A:
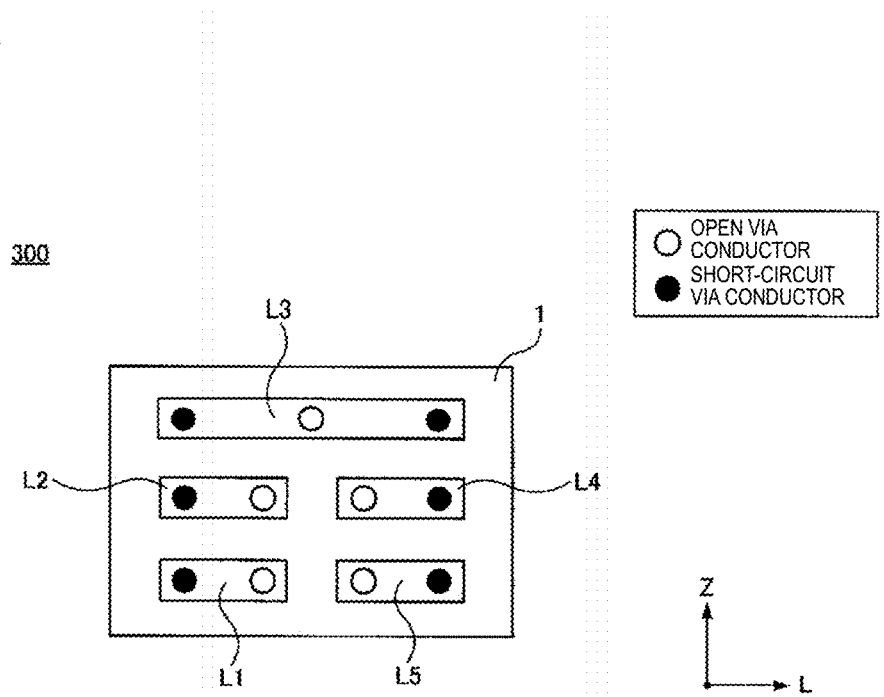
FIG. 15A is an explanatory diagram (perspective plan view) of a multilayer LC filter 300 according to a third preferred embodiment of the present invention.
Figure 15B:
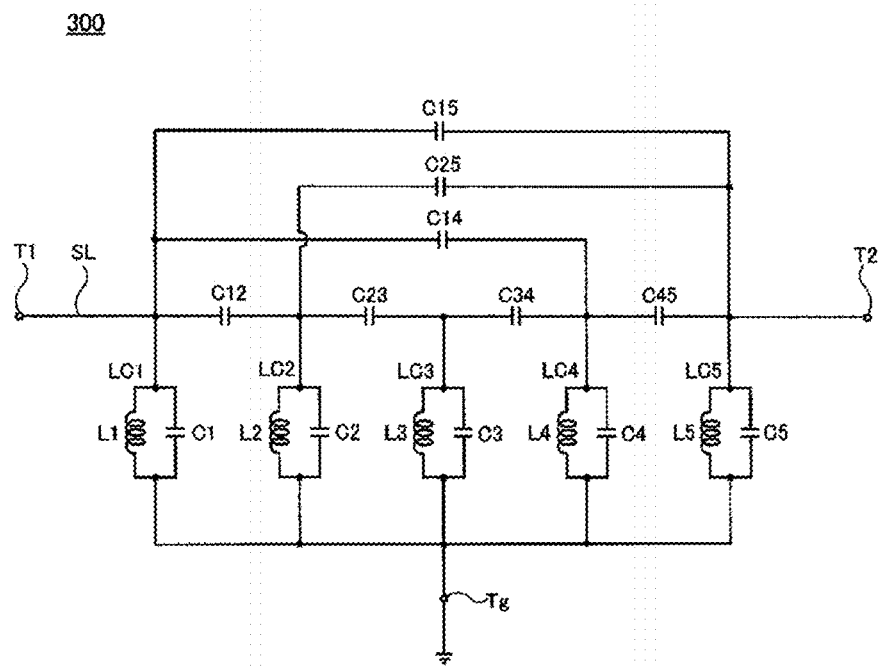
FIG. 15B is an equivalent circuit diagram of the multilayer LC filter 300.

A multilayer LC filter 300 according to a third preferred embodiment is illustrated in FIGS. 15A and 15B. FIG. 15A is an explanatory view (perspective plan view) of the multilayer LC filter 300. FIG. 15B is an equivalent circuit diagram of the multilayer LC filter 300.

The multilayer LC filter 300 is a five stage band pass filter in which five LC parallel resonators LC1 to LC5 are formed in the multilayer body 1.

The open via conductors and the short-circuit via conductors of inductors L1 to L5 of the resonators LC1 to LC5 are illustrated in FIG. 15A, respectively. As can be seen in FIG. 15A, in the multilayer LC filter 300, in all the inductors L1 to L5 of the LC parallel resonators LC1 to LC5, the open via conductors are disposed closer to the center in the length direction L, and the short-circuit via conductors are disposed closer to the outer side in a length direction L. As a result, all the open via conductors are disposed closer to the center of the multilayer body 1.

As can be seen in the equivalent circuit diagram of FIG. 15(B), in the multilayer LC filter 300, three jump-coupling capacitors C14, C15, and C25 are provided in the multilayer body 1. In the multilayer LC filter 300, all the open via conductors of the inductors L1 to L5 are disposed closer to the center of the multilayer body 1, and thus the jump-coupling capacitors C14, C15, and C25 may easily be formed.

Fourth Preferred Embodiment: Multilayer LC Filter
400

Figure 16A:
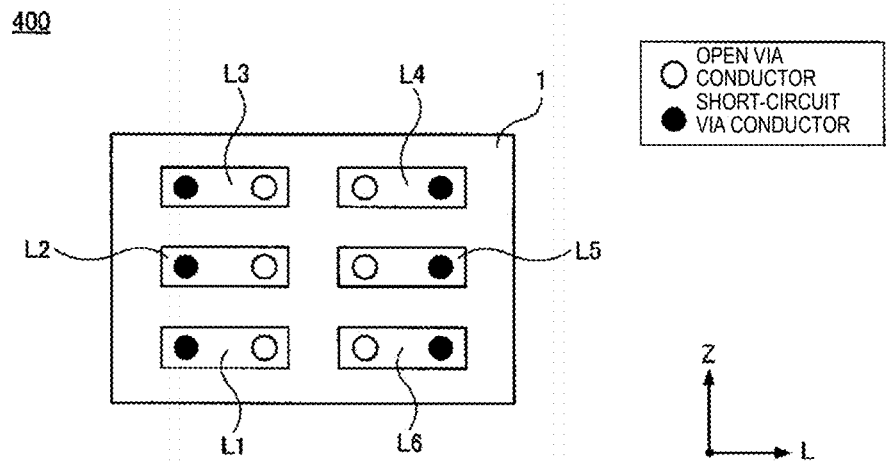
FIG. 16A is an explanatory diagram (perspective plan view) of a multilayer LC filter 400 according to the third preferred embodiment of the present invention.
Figure 16B:
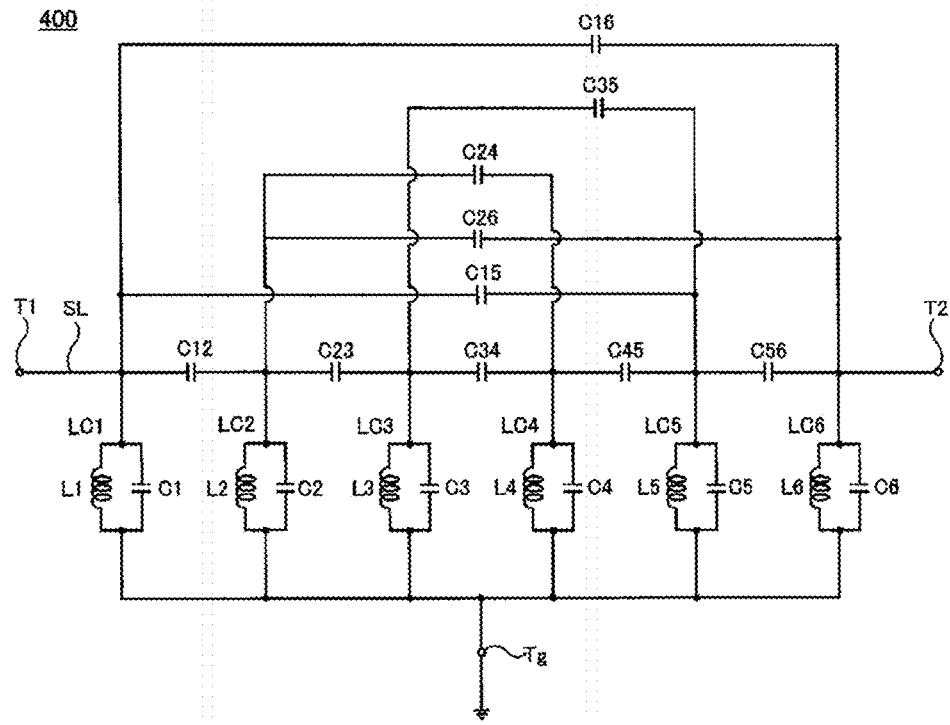
FIG. 16B is an equivalent circuit diagram of the multilayer LC filter 400.

A multilayer LC filter 400 according to a fourth preferred embodiment is illustrated in FIGS. 16A and 16B). FIG. 16A is an explanatory view (perspective plan view) of the multilayer LC filter 400. FIG. 16B is an equivalent circuit diagram of the multilayer LC filter 400.

The multilayer LC filter 400 is a six stage band pass filter in which six LC parallel resonators LC1 to LC6 are formed in the multilayer body 1.

Open via conductors and short-circuit via conductors of inductors L1 to L6 of resonators LC1 to LC6 are illustrated in FIG. 16A, respectively. As can be seen in FIG. 16A, in the multilayer LC filter 400, in all the inductors L1 to L6 of the LC parallel resonators LC1 to LC6, the open via conductors are disposed closer to the center in a length direction L, and the short-circuit via conductors are disposed closer to the outer side in the length direction L. As a result, all the open via conductors are disposed closer to the center of the multilayer body 1.

As can be seen in the equivalent circuit diagram of FIG. 16(B), in the multilayer LC filter 400, five jump-coupling capacitors C15, C16, C24, C26, and C35 are formed in the multilayer body 1. In the multilayer LC filter 400, all the open via conductors of the inductors L1 to L6 are disposed closer to the center of the multilayer body 1, and thus the jump-coupling capacitors C15, C16, C24, C26, and C35 may easily be formed.

Fifth Preferred Embodiment: Multilayer LC Filter
500

Figure 17:
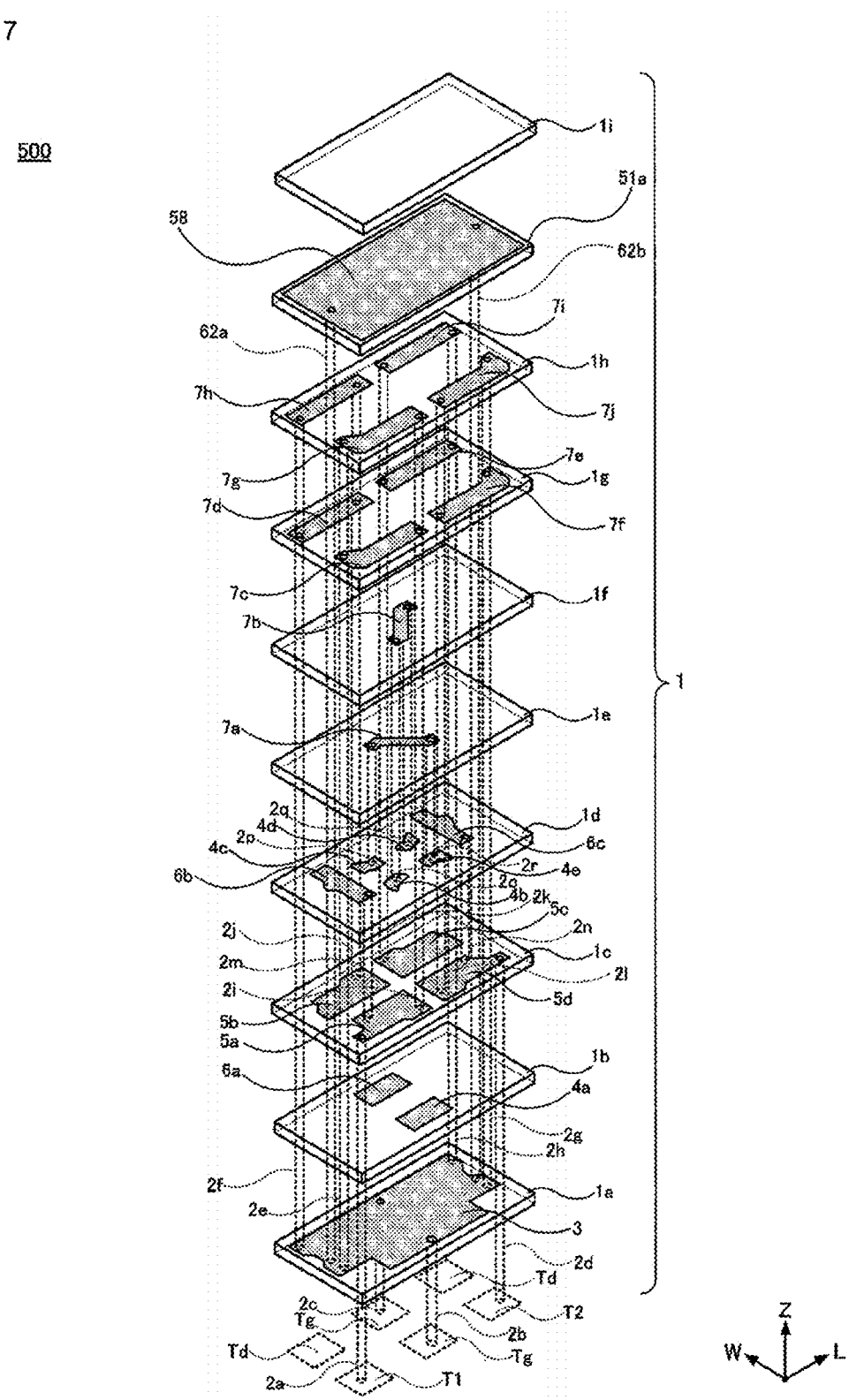
FIG. 17 is an exploded perspective view of a multilayer LC filter 500 according to a fifth preferred embodiment of the present invention.

A multilayer LC filter 500 according to a fifth preferred embodiment is illustrated in FIG. 17, FIGS. 18A and 18B. FIG. 17 is an exploded perspective view of the multilayer LC filter 500. FIG. 18A is an exploded perspective view of a main portion of the multilayer LC filter 500. FIG. 18A illustrates only elements of the multilayer LC filter 500 necessary for description while the dielectric layers 1a to 1i and the like are omitted. FIG. 18B is an explanatory diagram (perspective plan view) of the multilayer LC filter 500 illustrating a positional relationship between a shielding conductor pattern 58 described later and the line-shaped conductor patterns 7c to 7j.

In the multilayer LC filter 500 according to the fifth preferred embodiment, new elements are added to the multilayer LC filter 200 according to the second preferred embodiment illustrated in FIG. 8. Specifically, in the multilayer LC filter 500, a dielectric layer 51a, the shielding conductor pattern 58, and shield via conductors 62a and 62b are added to the multilayer LC filter 200.

In the multilayer LC filter 500, the new dielectric layer 51a is added between the dielectric layers 1h and 1i of the multilayer body 1.

The rectangular shielding conductor pattern 58 is provided on an upper main surface of the dielectric layer 51a. However, the shielding conductor pattern 58 may have any shape and is not limited to a rectangular shape.

The shield via conductors 62a and 62b each penetrate through the dielectric layers 1b to 1h and the dielectric layer 51a. The shielding conductor pattern 58 is directly connected to the ground conductor pattern 3 by the shield via conductors 62a and 62b. Although the number of shield via conductors is two in the present preferred embodiment, the number of shield via conductors is arbitrary and may be one, or three or more.

As illustrated in FIG. 18B, in the multilayer LC filter 500, the shielding conductor pattern 58 covers the line-shaped conductor patterns 7c to 7j when the multilayer body 1 is seen through in a height direction.

As a result, the variation in the characteristics of the multilayer LC filter 500 is reduced or prevented even when a metal is closely placed. That is, in a case that the shielding conductor pattern 58 is not provided, for example, when the metal is closely placed above the multilayer body 1, the magnetic field formation of the inductor of each LC parallel resonator of the multilayer LC filter is affected, and strength of the magnetic coupling between two LC parallel resonators varies. Then, the overall characteristics of the multilayer LC filter vary. Therefore, in the multilayer LC filter 500, the variation in characteristics is reduced by providing the shielding conductor pattern 58, even when the metal is placed close to the periphery of the multilayer body 1.

More specifically, in the multilayer LC filter 500, the shielding conductor pattern 58 prevents the magnetic field of the inductor of each LC parallel resonator from leaking to the periphery of the multilayer body 1. Therefore, in the multilayer LC filter 500, the variation in characteristics is small even when the metal is placed close to the periphery of the multilayer body 1. This effect will be described later in Experiment 1.

The equivalent circuit of the multilayer LC filter 500 is the same as the equivalent circuit of the multilayer LC filter 200 illustrated in FIG. 9.

First Modification of Fifth Preferred Embodiment: Multilayer LC Filter 510

Figure 19A:
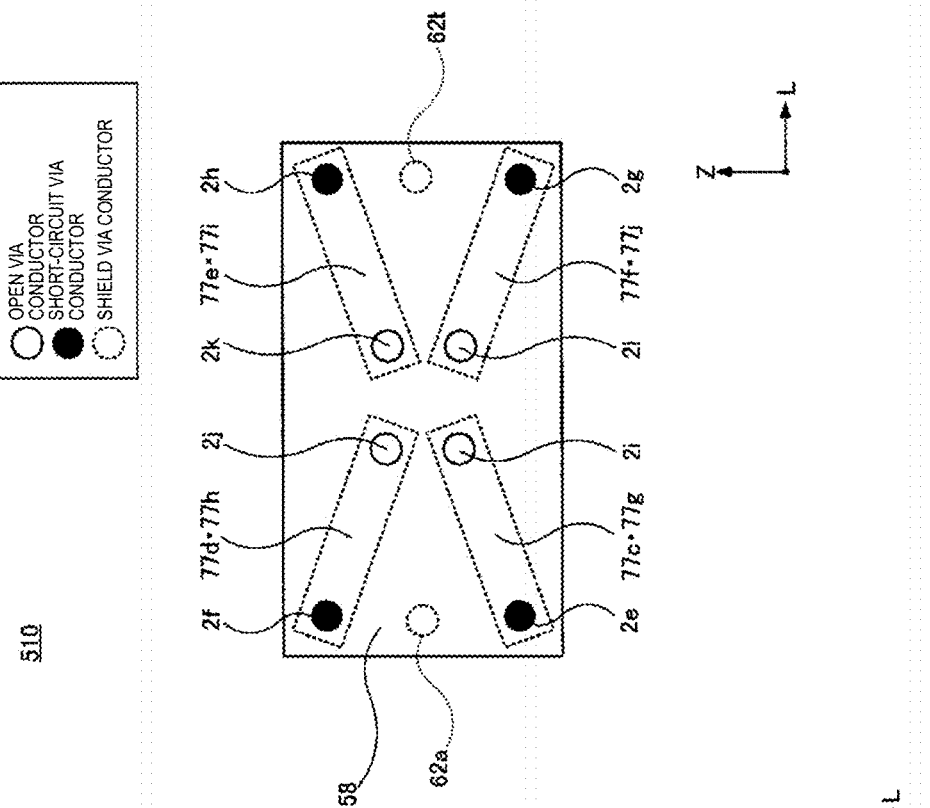
FIG. 19A is an exploded perspective view of a main portion of a multilayer LC filter 510 according to a first modification of the multilayer LC filter 500.
Figure 19B:
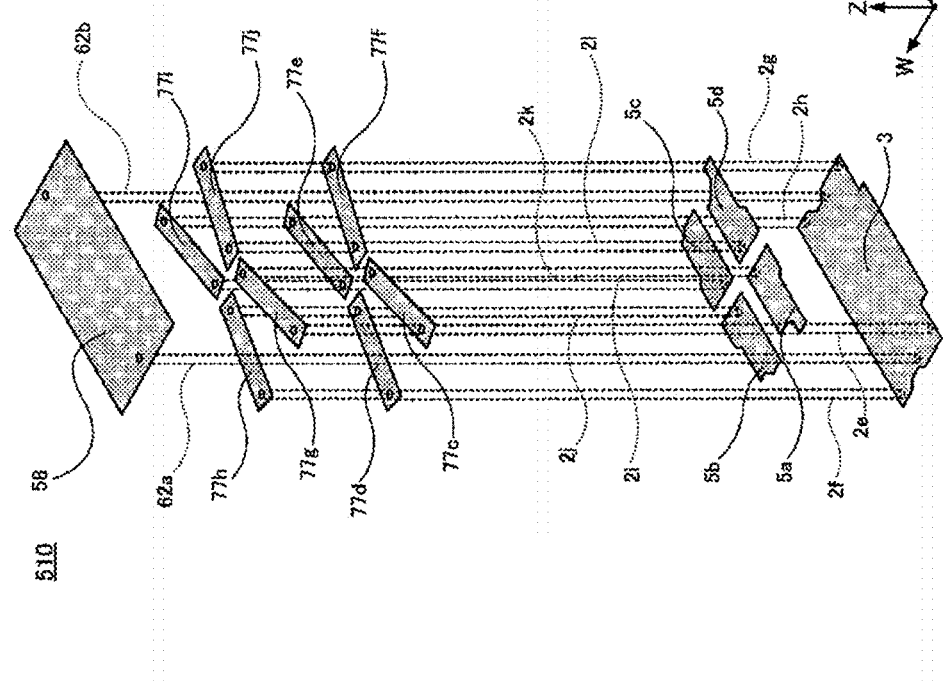
FIG. 19B is an explanatory view (perspective plan view) of the multilayer LC filter 510.

A multilayer LC filter 510 according to a first modification of the fifth preferred embodiment is illustrated in FIGS. 19A and 19B. FIG. 19A is an exploded perspective view of a main portion of the multilayer LC filter 510. FIG. 19B is an explanatory diagram (perspective plan view) of the multilayer LC filter 510 illustrating the positional relationship between the shielding conductor pattern 58 and the line-shaped conductor patterns 77c to 77j.

The multilayer LC filter 510 according to the first modification is obtained by improving the multilayer LC filter 500 according to the fifth preferred embodiment. That is, in the multilayer LC filter 510, the variation in characteristics when a metal is placed close to the periphery of the multilayer body 1 is reduced or prevented more than in the multilayer LC filter 500.

In the multilayer LC filter 500, as illustrated in FIG. 18 (B), when seen through in a planar direction, a gap G between the line-shaped conductor patterns 7c to 7j and the shielding conductor pattern 58 is small, and the magnetic field generated by the line-shaped conductor patterns 7c to 7j still leaks to the periphery of the multilayer body 1. Thus, there is room for improvement. Then, in the multilayer LC filter 510, by moving the line-shaped conductor pattern toward the center of the multilayer body 1, the leakage of the magnetic field to the periphery of the multilayer body 1 is further reduced or prevented. This results in the variation in characteristics being further reduced or prevented.

As illustrated in FIG. 19A and FIG. 19B, in the multilayer LC filter 510, when the multilayer body 1 is seen through in the height direction, the open via conductors 2i, 2j, 2k, and 2l are each moved and disposed in the vicinity of the center of the multilayer body 1. On the other hand, the short-circuit via conductors 2e, 2f, 2g, and 2h are each disposed in the vicinity of the peripheral edge of the multilayer body 1. As a result, in the multilayer LC filter 510, the line-shaped conductor patterns 77c to 77j are each radially disposed from the vicinity of the center of the multilayer body 1 toward the vicinity of the peripheral edge thereof.

In the multilayer LC filter 510, the short-circuit via conductors 2e to 2h are each not moved toward the center of the multilayer body 1 because respective distances between the shield via conductors 62a and 62b and the short-circuit via conductors 2e to 2h need to be ensured. That is, when the short-circuit via conductors 2e to 2h are respectively disposed close to the shield via conductors 62a and 62b having ground potential, stray capacitance is generated therebetween, and the characteristics of the LC parallel resonators may undesirably vary.

In the multilayer LC filter 510 in which the line-shaped conductor patterns 77c to 77j are radially disposed from the vicinity of the center toward the vicinity of the peripheral edge of the multilayer body 1, the leakage of the magnetic field to the outside of the multilayer body 1 is further reduced or prevented than in the multilayer LC filter 500. This results in the characteristics being even less likely to vary even when a metal is placed close to the multilayer body 1.

Experiment 1

Experiment 1 illustrated in FIG. 20A1, FIG. 20A2, FIG. 20B1 and FIG. 20B2 was carried out in order to confirm that providing the shielding conductor pattern 58 is effective in suppressing the variation in characteristics when a metal is closely placed.

First, the multilayer LC filter 510 was prepared. A multilayer LC filter 520 was prepared in which the shielding conductor pattern 58 and the shield via conductors 62a and 62b were omitted from the multilayer LC filter 510.

As illustrated in FIG. 20A1, the multilayer LC filter 510 was mounted on a substrate, and the characteristics were measured in three cases, that is, when a metal (metal plate) was not closely placed above the multilayer LC filter 510, when a metal was placed in a far position F, and when a metal was placed in a near position N. The measurement results of the characteristics are illustrated in FIG. 20A2.

Next, as illustrated in FIG. 20B1, the multilayer LC filter 520 was mounted on a substrate, and the characteristics were measured in three cases, that is, when a metal (metal plate) was not closely placed above the multilayer LC filter 520, when a metal was placed in a far position F, and when a metal was placed in a near position N. The measurement results of the characteristics are illustrated in FIG. 20B2.

As can be seen in a comparison of FIG. 20A1 with FIG. 20B1, the characteristics of the multilayer LC filter 520 in which the shielding conductor pattern 58 is omitted greatly vary when a metal is closely placed. On the other hand, in the multilayer LC filter 510 including the shielding conductor pattern 58, the variation in characteristics is small even when a metal is closely placed. From the above, it was confirmed that providing the shielding conductor pattern 58 is effective in suppressing the variation in characteristics when a metal is closely placed.

Second Modification of Fifth Preferred Embodiment: Multilayer LC Filter 530

Third Modification of Fifth Preferred Embodiment: Multilayer LC Filter 540

Figure 21A:
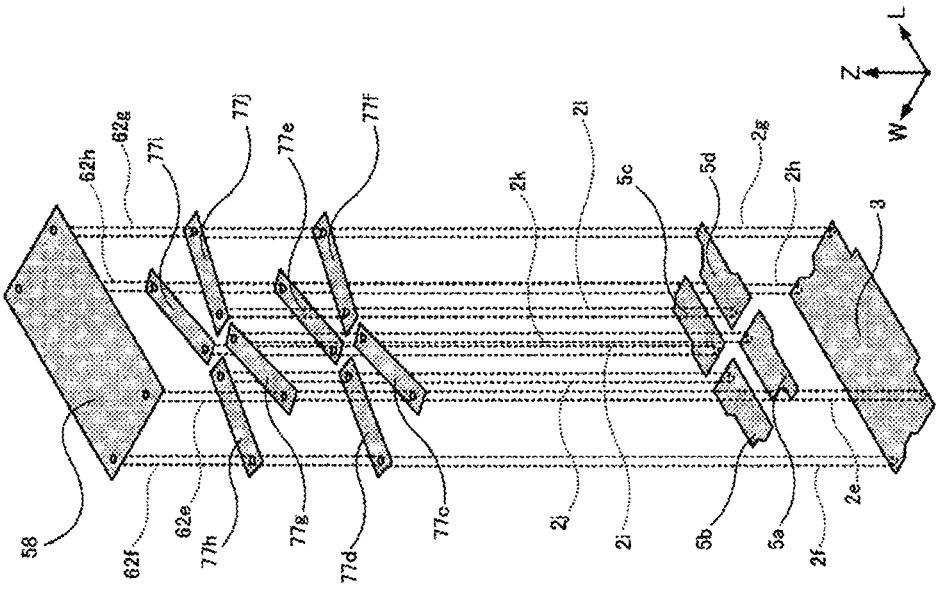
FIG. 21A is an exploded perspective view of a main portion of a multilayer LC filter 530 according to a second modification of the multilayer LC filter 500.
Figure 21B:
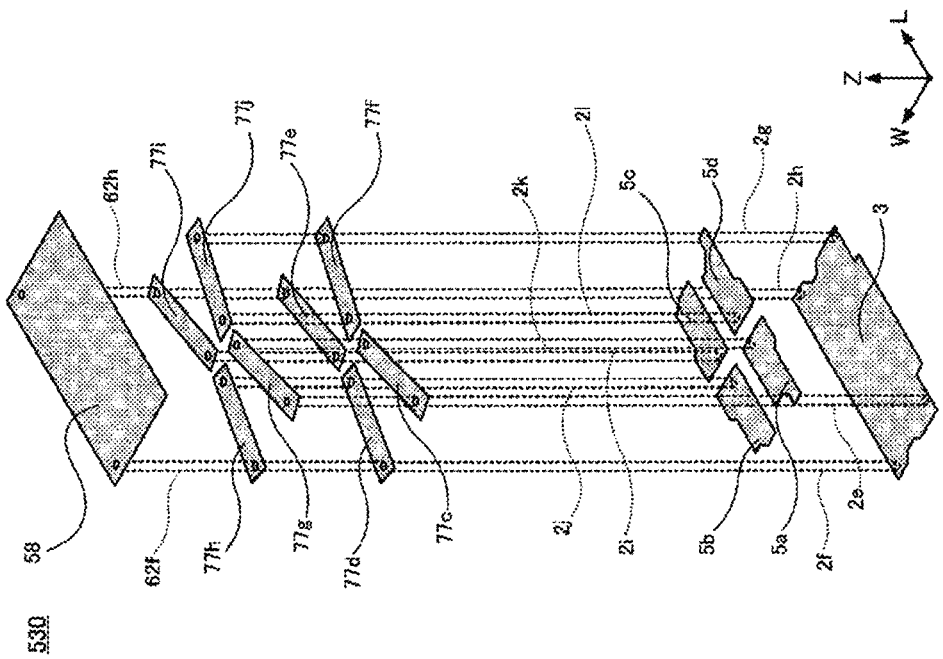
FIG. 21B is an exploded perspective view of a main portion of a multilayer LC filter 540 according to a third modification of the multilayer LC filter 500.

A multilayer LC filter 530 of a second modification of the fifth preferred embodiment is illustrated in FIG. 21A. A multilayer LC filter 540 of a third modification of the fifth preferred embodiment is illustrated in FIG. 21B. FIG. 21A is a perspective view of a main portion of the multilayer LC filter 530. FIG. 21B is a perspective view of a main portion of the multilayer LC filter 540.

The multilayer LC filters 530 and 540 are each obtained by modifying the configuration of the multilayer LC filter 510 according to the first modification of the fifth preferred embodiment illustrated in FIG. 19A and FIG. 19B.

Specifically, in the multilayer LC filter 510, the shielding conductor pattern 58 is directly connected to the ground conductor pattern 3 by the shield via conductors 62*a* and 62*b*. In the multilayer LC filter 530 being the second modification, the configuration described above is changed as follows. The shielding conductor pattern 58 is connected to the line-shaped conductor pattern 77*h* on the short-circuit via 2*f* side by a shield via conductor 62*f*, and is connected to the line-shaped conductor pattern 77*i* on the short-circuit via 2*h* side by a shield via conductors 62*h*. That is, in the multilayer LC filter 530, the shielding conductor pattern 58 is not directly connected to the ground conductor pattern 3 by the shield via conductor, but is indirectly connected to the ground conductor pattern 3 through the shield via conductors 62*f* and 62*h* and the short-circuit via conductors 2*f* and 2*h*.

In the multilayer LC filter 540 being the third modification, new elements are further added to the multilayer LC filter 530 being the second modification. That is, further, the shielding conductor pattern 58 is connected to the line-shaped conductor pattern 77*g* on the short-circuit via 2*e* side by a shield via conductor 62*e*, and is connected to the line-shaped conductor pattern 77*j* on the short-circuit via 2*g* side by a shield via conductor 62*g*. That is, in the multilayer LC filter 540, the shielding conductor pattern 58 is not directly connected to the ground conductor pattern 3 by the shield via conductor, but is indirectly connected to the ground conductor pattern 3 through the shield via conductors 62*e*, 62*f*, 62*g*, and 62*h* and the short-circuit via conductors 2*e*, 2*f*, 2*g*, and 2*h*.

As described above, it is acceptable that the shielding conductor pattern 58 is not directly connected to the ground conductor pattern 3 by the shield via conductor, but is indirectly connected to the ground conductor pattern 3 through an element other than the shield via conductor. The method above is effective when there is no room in the internal volume of the multilayer body 1 and the shielding conductor pattern 58 cannot directly be connected to the ground conductor pattern 3 by the shield via conductor.

However, in a case that the shielding conductor pattern 58 is not directly connected to the ground conductor pattern 3 by the shield via conductor, but is indirectly connected to the ground conductor pattern 3 through an element other than the shield via conductor, the characteristics may vary. For example, in the multilayer LC filter 530, the inductor L2 of the LC parallel resonator LC2 including the short-circuit via conductor 2*e*, the line-shaped conductor patterns 77*d* and 77*h*, and the open via conductor 2*j* and the inductor L3 of the LC parallel resonator LC3 including the short-circuit via conductor 2*h*, the line-shaped conductor patterns 77*e* and 77*i*, and the open via conductor 2*k* are connected at an intermediate portion through the shield via conductor 62*f*, the shielding conductor pattern 58, and the shield via conductor 62*h*. This strengthens the magnetic coupling between the inductor L2 and the inductor L3, and the characteristics may vary. Therefore, if possible, it is preferable that the shielding conductor pattern 58 and the ground conductor pattern 3 be directly connected by the shield via conductor.

Sixth Preferred Embodiment: Multilayer LC Filter 600

Figure 22:
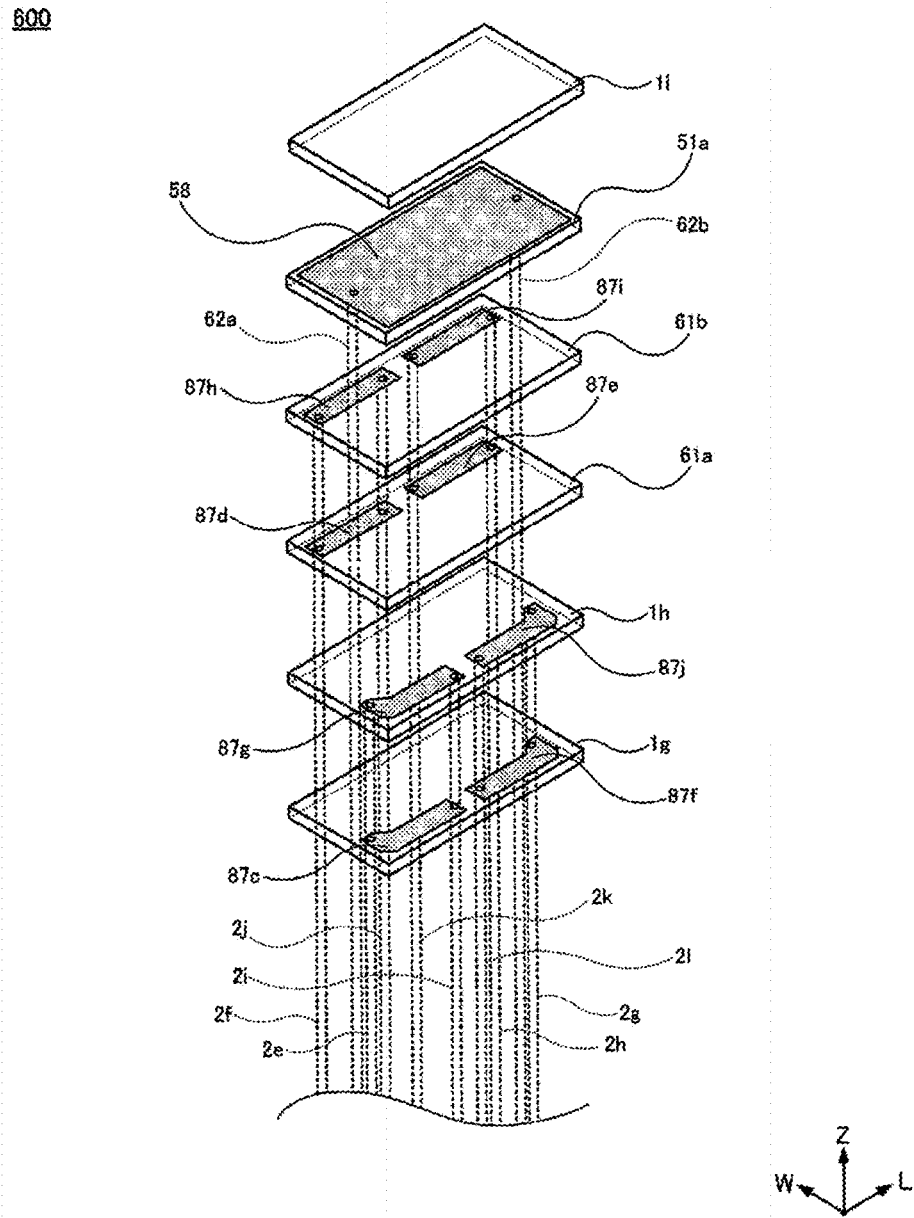
FIG. 22 is an exploded perspective view of a main portion of a multilayer LC filter 600 according to a sixth preferred embodiment of the present invention.

A multilayer LC filter 600 according to a sixth preferred embodiment is illustrated in FIG. 22, FIGS. 23A and 23B. FIG. 22 is an exploded perspective view of a main portion of the multilayer LC filter 600. FIG. 23A is also an exploded perspective view of a main portion of the multilayer LC filter 600. FIG. 23B is an explanatory diagram (perspective plan view) of the multilayer LC filter 600 illustrating a positional relationship between the shielding conductor pattern 58 and the line-shaped conductor patterns 87*c* to 87*j*.

The multilayer LC filter 600 according to the sixth preferred embodiment is obtained by further improving the multilayer LC filter 500 according to the fifth preferred embodiment illustrated in FIG. 17, FIGS. 18A and 18B.

In the multilayer LC filter 500 according to the fifth preferred embodiment, the line-shaped conductor pattern 7*c* of the inductor L1 of the LC parallel resonator LC1, the line-shaped conductor pattern 7*d* of the inductor L2 of the LC parallel resonator LC2, the line-shaped conductor pattern 7*e* of the inductor L3 of the LC parallel resonator LC3, and the line-shaped conductor pattern 7*f* of the inductor L4 of the LC parallel resonator LC4 are all provided on the same dielectric layer of the multilayer body 1; and the line-shaped conductor pattern 7*g* of the inductor L1 of the LC parallel resonator LC1, the line-shaped conductor pattern 7*h* of the inductor L2 of the LC parallel resonator LC2, the line-shaped conductor pattern 7*i* of the inductor L3 of the LC parallel resonator LC3, and the line-shaped conductor pattern 7*j* of the inductor L4 of the LC parallel resonator LC4 are all provided on the same dielectric layer of the multilayer body 1. Therefore, in the multilayer LC filter 500, when the two multilayer LC filters 500 are mounted close to each other on a substrate or the like, unnecessary magnetic coupling occurs between the multilayer LC filters 500. This may cause a problem that the variation may occur in characteristics of the two multilayer LC filters 500.

Then, in the multilayer LC filter 600 according to the sixth preferred embodiment, two dielectric layers 61*a* and 61*b* are added between the dielectric layers 1*h* and 51*a* as illustrated in FIG. 22. Then, the line-shaped conductor pattern 87*c* of the inductor L1 of the LC parallel resonator LC1 and the line-shaped conductor pattern 87*f* of the inductor L4 of the LC parallel resonator LC4 are provided on the dielectric layer 1*g* that is originally present. Further, the line-shaped conductor pattern 87*g* of the inductor L1 of the LC parallel resonator LC1 and the line-shaped conductor pattern 87*j* of the inductor L4 of the LC parallel resonator LC4 are provided on the dielectric layer 1*h* that is originally present. Then, the line-shaped conductor pattern 87*d* of the inductor L2 of the LC parallel resonator LC2 and the line-shaped conductor pattern 87*e* of the inductor L3 of the LC parallel resonator LC3 are provided on the added dielectric layer 61*a*. Further, the line-shaped conductor pattern 87*h* of the inductor L2 of the LC parallel resonator LC2 and the line-shaped conductor pattern 87*i* of the inductor L3 of the LC parallel resonator LC3 are provided on the added dielectric layer 61*b*.

As a result, in a case that two multilayer LC filters 600 are mounted on a substrate or the like being aligned in the same direction, even when the two multilayer LC filters 600 are mounted close to each other, unnecessary magnetic coupling between the multilayer LC filters 600 is reduced or prevented to occur, and the variation in characteristics is reduced or prevented. This effect will be described later in Experiment 2.

First Modification of Sixth Preferred Embodiment: Multilayer LC Filter 610

A multilayer LC filter 610 according to a first modification of the sixth preferred embodiment is illustrated in FIGS. 24A and 24B. FIG. 24A is an exploded perspective view of a main portion of the multilayer LC filter 610. FIG. 24B is an explanatory diagram (perspective plan view) of the multilayer LC filter 610 illustrating a positional relationship between the shielding conductor pattern 58 and the line-shaped conductor patterns 97c to 97j.

The multilayer LC filter 610 according to the first modification is obtained by improving the multilayer LC filter 600 according to the sixth preferred embodiment. That is, in the multilayer LC filter 610, the variation in characteristics when a metal is placed close to the periphery of the multilayer body 1 is further reduced or prevented than that in the multilayer LC filter 600.

The multilayer LC filter 610 aims at an effect similar to that of the multilayer LC filter 510 according to the first modification of the fifth preferred embodiment illustrated in FIGS. 19A and 19B.

In the multilayer LC filter 610, as illustrated in FIGS. 24A and 24B, when the multilayer body 1 is seen through in a height direction, the open via conductors 2i, 2j, 2k, and 2l are each moved and disposed in the vicinity of the center of the multilayer body 1. On the other hand, the short-circuit via conductors 2e, 2f, 2g, and 2h are each disposed in the vicinity of the peripheral edge of the multilayer body 1. As a result, in the multilayer LC filter 610, the line-shaped conductor patterns 97c to 97j are each radially disposed from the vicinity of the center toward the vicinity of the peripheral edge of the multilayer body 1.

In the multilayer LC filter 610, the leakage of a magnetic field to the outside of the multilayer body 1 is further reduced or prevented than that in the multilayer LC filter 600, and the characteristics are less likely to vary even when a metal is placed close to the multilayer body 1. The reason for the above has been described in the description of the multilayer LC filter 510 according to the first modification of the fifth preferred embodiment, and thus, will not be described here.

Experiment 2

In order to confirm effectiveness of the sixth preferred embodiment, Experiment 2 illustrated in FIG. 25A1, FIG. 25A2, FIG. 25B1 and FIG. 25B2 was performed.

First, four multilayer LC filters 610 according to the first modification were prepared. Then, the characteristics of the multilayer LC filter 610 alone were measured.

Next, as illustrated in FIG. 25A1, two multilayer LC filters 610 were mounted on a substrate being aligned in the same direction with a gap of about 100 μm, for example. The characteristics of the multilayer LC filter 610 in the case above is illustrated in FIG. 25A2.

Further, as illustrated in FIG. 25B1, two multilayer LC filters 610 were mounted on a substrate in opposite directions with a gap of about 100 μm, for example. The characteristics of the multilayer LC filter 610 in the case above is illustrated in FIG. 25B2.

As can be seen in a comparison between FIG. 25B1 and FIG. 25B2, the variation in the characteristics is smaller in the case that the two multilayer LC filters 610 are mounted being aligned in the same direction than in the case that the two multilayer LC filters 610 are closely mounted in the opposite direction. This is considered to be an effect that the occurrence of unnecessary magnetic coupling between the two multilayer LC filters 610 is reduced or prevented by forming the line-shaped conductor patterns of the different LC parallel resonators in different layers of the multilayer body 1.

By forming the line-shaped conductor patterns of different LC parallel resonators in different layers of the multilayer body 1 as in the multilayer LC filters 600 and 610 according to the sixth preferred embodiment, and mounting the two multilayer LC filters being aligned in the same direction, the variation in characteristics may be reduced or prevented even when the two multilayer LC filters are mounted close to each other.

Hereinabove, the first preferred embodiment to the sixth preferred embodiment have been described. However, the present invention is not limited to the contents described above, and various modifications can be made within the spirit of the present invention.

For example, in the above-described preferred embodiments, the open via conductor is disposed closer to the center of the multilayer body and the short-circuit via conductor is disposed closer to the outer side of the multilayer body in a length direction. However, instead of the above, the open via conductor may be disposed closer to the center of the multilayer body and the short-circuit via conductor may be disposed closer to the outer side of the multilayer body in both the length direction and a width direction.

A multilayer LC filter according to a preferred embodiment of the present invention is as described in the section of "Solution to Problem".

In the multilayer LC filter above, it is also preferable that a jump-coupling capacitor conductor pattern, to provide jump-coupling of at least one of the LC parallel resonators and at least another one of the LC parallel resonators separated from each other in an equivalent circuit with capacitive coupling, be provided. In the case above, the multilayer LC filter may be adjusted to a desired frequency characteristic by the jump-coupling.

Further, it is also preferable that the multilayer LC filter be configured as follows. In at least one of the LC parallel resonators, on one of the dielectric layers between ones of the dielectric layers on which a capacitor conductor pattern and the ground conductor pattern of a capacitor of the LC parallel resonator are respectively formed, an adjustment capacitor conductor pattern to adjust capacitance of the capacitor is formed, and the adjustment capacitor conductor pattern is connected to either the capacitor conductor pattern or the ground conductor pattern by a via conductor. In the case above, the capacitance of the capacitor of the LC parallel resonator may easily be adjusted, and the multilayer LC filter may be adjusted to have a desired frequency characteristic.

It is also preferable that, on one of the dielectric layers that is the same as the one of the dielectric layers on which the adjustment capacitor conductor pattern is formed, a jump-coupling capacitor conductor pattern, to provide jump-coupling of the at least one of the LC parallel resonators and at least another one of the LC parallel resonators separated from each other in the equivalent circuit with capacitive coupling, be formed. In the case above, the jump-coupling capacitor conductor pattern may be formed without increasing the size of the multilayer body 1 in the height direction.

It is also preferable that a short-circuit via conductor of at least one of the LC parallel resonators and a short-circuit via conductor of at least another one of the LC parallel resonators be connected at a connection point, and the connection point and the ground conductor pattern be connected by a common short-circuit via conductor. In the case above, the magnetic coupling between the two LC parallel resonators may be strengthened, and the multilayer LC filter may be adjusted to have a desired frequency characteristic.

It is also preferable that a multilayer body include a main surface on a mounting side and a main surface on a non-mounting side, a shielding conductor pattern be provided on one of the dielectric layers of the multilayer body between the first line-shaped conductor pattern, the second line-shaped conductor pattern, and the third line-shaped conductor pattern and the main surface on the non-mounting side, and a shielding conductor pattern layer be connected to the ground conductor pattern through a shield via conductor. In the case above, the variation in characteristics is reduced or prevented even when a metal is placed close to the periphery of the multilayer body.

In the case above, it is also preferable that the shielding conductor pattern be directly connected to the ground conductor pattern through the shield via conductor. With this, the variation in characteristics of the multilayer LC filter due to the presence of the shielding conductor pattern may be reduced.

It is also preferable that, when the multilayer body is seen through in the height direction, the first open via conductor, the second open via conductor, and the third open via conductor be each disposed in the vicinity of a center of the multilayer body, the first short-circuit via conductor, the second short-circuit via conductor, and the third short-circuit via conductor be each disposed in the vicinity of a peripheral edge of the multilayer body, and the first line-shaped conductor pattern, the second line-shaped conductor pattern, and the third line-shaped conductor pattern be each radially disposed from the vicinity of the center toward the vicinity of the peripheral edge. In the case above, the characteristics are further less likely to vary even when a metal is placed close to the multilayer body.

It is also preferable for multiple LC parallel resonators to be configured as follows. The multiple LC parallel resonators further include a fourth LC parallel resonator, and the fourth LC parallel resonator includes a fourth line-shaped conductor pattern, a fourth capacitor conductor pattern, a fourth open via conductor connecting the fourth line-shaped conductor pattern and the fourth capacitor conductor pattern, and a fourth short-circuit via conductor connecting the fourth line-shaped conductor pattern and the ground conductor pattern. When the multilayer body is seen through in the height direction, the first, second, third, and fourth open via conductors are each disposed in the vicinity of a center of the multilayer body, the first, second, third, and fourth short-circuit via conductors are each disposed in the vicinity of a peripheral edge of the multilayer body, and the first, second, third, and fourth line-shaped conductor patterns are each radially disposed from the vicinity of the center toward the vicinity of the peripheral edge. Also in the case above, the characteristics are further less likely to vary even when a metal is placed close to the multilayer body.

It is also preferable that the first line-shaped conductor pattern and the second line-shaped conductor pattern be disposed on different ones of the dielectric layers of the multilayer body. In the case above, under the condition that two multilayer LC filters are mounted on a substrate or the like being aligned in the same direction, the occurrence of unnecessary magnetic coupling between the multilayer LC filters is reduced or prevented even when the two multilayer LC filters are mounted close to each other. This results in the variation of characteristics being reduced or prevented.

It is also preferable for multiple LC parallel resonators to be configured as follows. The multiple LC parallel resonators further include a fourth LC parallel resonator, and the fourth LC parallel resonator includes a fourth line-shaped conductor pattern, a fourth capacitor conductor pattern, a fourth open via conductor connecting the fourth line-shaped conductor pattern and the fourth capacitor conductor pattern, and a fourth short-circuit via conductor connecting the fourth line-shaped conductor pattern and the ground conductor pattern. The first line-shaped conductor pattern and the fourth line-shaped conductor pattern are disposed on one of the dielectric layers of the multilayer body, the second line-shaped conductor pattern and the third line-shaped conductor pattern are disposed on one of the dielectric layers of the multilayer body, and the one of the dielectric layers of the multilayer body on which the first and fourth line-shaped conductor patterns are disposed is different from the one of the dielectric layers of the multilayer body on which the second and third line-shaped conductor patterns are disposed. In the case above as well, under the condition that two multilayer LC filters are mounted on a substrate or the like being aligned in the same direction, occurrence of unnecessary magnetic coupling between the multilayer LC filters is reduced or prevented even when the two multilayer LC filters are mounted close to each other. This results in the variation of characteristics being reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer LC filter to transfer a signal from an input terminal to an output terminal, the multilayer LC filter comprising:
    a multilayer body in which multiple dielectric layers are laminated; and
    multiple LC parallel resonators provided in the multilayer body and electromagnetically coupled to each other; wherein
    in at least one of the multiple LC parallel resonators:
        on one of the dielectric layers between ones of the dielectric layers on which a capacitor conductor pattern and a ground conductor pattern of a capacitor of the at least one of the multiple LC parallel resonators are respectively provided, an adjustment capacitor conductor pattern is provided to adjust a capacitance of the capacitor; and
        the adjustment capacitor conductor pattern is connected to either the capacitor conductor pattern or the ground conductor pattern by a via conductor;
    the multilayer body includes:
        a first line-shaped conductor pattern, a second line-shaped conductor pattern, and a third line-shaped conductor pattern between adjacent ones of the dielectric layers;
        a first capacitor conductor pattern, a second capacitor conductor pattern, and a third capacitor conductor pattern between adjacent ones of the dielectric layers; and
        at least one ground conductor pattern between adjacent ones of the dielectric layers;
    the multiple LC parallel resonators include a first LC parallel resonator, a second LC parallel resonator, and a third LC parallel resonator;
    the first LC parallel resonator includes the first line-shaped conductor pattern, a first open via conductor connecting the first line-shaped conductor pattern and the first capacitor conductor pattern, and a first short-circuit via conductor connecting the first line-shaped conductor pattern and the at least one ground conductor pattern;

the second LC parallel resonator includes the second line-shaped conductor pattern, a second open via conductor connecting the second line-shaped conductor pattern and the second capacitor conductor pattern, and a second short-circuit via conductor connecting the second line-shaped conductor pattern and the at least one ground conductor pattern;

the third LC parallel resonator includes the third line-shaped conductor pattern, a third open via conductor connecting the third line-shaped conductor pattern and the third capacitor conductor pattern, and a third short-circuit via conductor connecting the third line-shaped conductor pattern and the at least one ground conductor pattern; and when the multilayer body is seen through in a height direction of the multilayer body:
the first open via conductor is closer to the second open via conductor than to the second short-circuit via conductor and closer to the third open via conductor than to the third short-circuit via conductor; and
the second open via conductor is closer to the third open via conductor than to the third short-circuit via conductor.

2. The multilayer LC filter according to claim 1, further comprising a jump-coupling capacitor conductor pattern to provide jump-coupling of at least one of the LC parallel resonators and at least another one of the LC parallel resonators separated from each other in an equivalent circuit with capacitive coupling.

3. The multilayer LC filter according to claim 1, further comprising a jump-coupling capacitor conductor pattern on one of the dielectric layers that is same as the one of the dielectric layers on which the adjustment capacitor conductor pattern is provided to provide jump-coupling of the at least one of the LC parallel resonators and at least another one of the LC parallel resonators separated from each other in an equivalent circuit with capacitive coupling.

4. The multilayer LC filter according to claim 1, wherein a short-circuit via conductor of at least one of the LC parallel resonators and a short-circuit via conductor of at least another one of the LC parallel resonators are connected at a connection point, and the connection point and the at least one ground conductor pattern are connected by a common short-circuit via conductor.

5. The multilayer LC filter according to claim 1, wherein the multilayer body includes a main surface on a mounting side and a main surface on a non-mounting side;
a shielding conductor pattern is provided on one of the dielectric layers of the multilayer body between the first line-shaped conductor pattern, the second line-shaped conductor pattern, and the third line-shaped conductor pattern and the main surface on the non-mounting side; and
the shielding conductor pattern is connected to the at least one ground conductor pattern through a shield via conductor.

6. The multilayer LC filter according to claim 5, wherein the shielding conductor pattern is directly connected to the at least one ground conductor pattern through the shield via conductor.

7. The multilayer LC filter according to claim 1, wherein when the multilayer body is seen through in the height direction:

the first open via conductor, the second open via conductor, and the third open via conductor are each located in a vicinity of a center of the multilayer body;
the first short-circuit via conductor, the second short-circuit via conductor, and the third short-circuit via conductor are each located in a vicinity of a peripheral edge of the multilayer body; and
the first line-shaped conductor pattern, the second line-shaped conductor pattern, and the third line-shaped conductor pattern each radially extend from the vicinity of the center toward the vicinity of the peripheral edge.

8. The multilayer LC filter according to claim 7, wherein the multiple LC parallel resonators further include a fourth LC parallel resonator including a fourth line-shaped conductor pattern, a fourth capacitor conductor pattern, a fourth open via conductor connecting the fourth line-shaped conductor pattern and the fourth capacitor conductor pattern, and a fourth short-circuit via conductor connecting the fourth line-shaped conductor pattern and the at least one ground conductor pattern; and when the multilayer body is seen through in the height direction:
the first open via conductor, the second open via conductor, the third open via conductor, and the fourth open via conductor are each located in the vicinity of the center of the multilayer body;
the first short-circuit via conductor, the second short-circuit via conductor, the third short-circuit via conductor, and the fourth short-circuit via conductor are each located in the vicinity of the peripheral edge of the multilayer body; and
the first line-shaped conductor pattern, the second line-shaped conductor pattern, the third line-shaped conductor pattern, and the fourth line-shaped conductor pattern each radially extend from the vicinity of the center toward the vicinity of the peripheral edge.

9. The multilayer LC filter according to claim 1, wherein the first line-shaped conductor pattern and the second line-shaped conductor pattern are located on different ones of the dielectric layers of the multilayer body.

10. The multilayer LC filter according to claim 9, wherein the multiple LC parallel resonators further include a fourth LC parallel resonator including a fourth line-shaped conductor pattern, a fourth capacitor conductor pattern, a fourth open via conductor connecting the fourth line-shaped conductor pattern and the fourth capacitor conductor pattern, and a fourth short-circuit via conductor connecting the fourth line-shaped conductor pattern and the at least one ground conductor pattern;

the first line-shaped conductor pattern and the fourth line-shaped conductor pattern are located on one of the dielectric layers of the multilayer body;
the second line-shaped conductor pattern and the third line-shaped conductor pattern are located on one of the dielectric layers of the multilayer body; and
the one of the dielectric layers of the multilayer body on which the first line-shaped conductor pattern and the fourth line-shaped conductor pattern are located is different from the one of the dielectric layers of the multilayer body on which the second line-shaped conductor pattern and the third line-shaped conductor pattern are located.

11. The multilayer LC filter according to claim 1, wherein the multilayer LC filter is one of a band pass filter, a low pass filter, or a high pass filter.

12. The multilayer LC filter according to claim 1, wherein the first LC parallel resonator and the second LC parallel resonator are capacitively coupled to each other, the second LC parallel resonator and the third LC parallel resonator are capacitively coupled to each other, and the first LC parallel resonator and the third LC parallel resonator are capacitively coupled to each other.

13. The multilayer LC filter according to claim 1, wherein the multilayer LC filter is a 3 stage band pass filter.

14. The multilayer LC filter according to claim 1, wherein two stage attenuation poles are provided on a low frequency side or on a high frequency side.

15. The multilayer LC filter according to claim 1, wherein a shape of the first line-shaped conductor pattern, the second line-shaped conductor pattern, and the third line-shaped conductor pattern is a linear shape or a T-shape.

16. The multilayer LC filter according to claim 10, wherein the first LC parallel resonator and the second LC parallel resonator are capacitively coupled to each other, the second LC parallel resonator and the third LC parallel resonator are capacitively coupled to each other, and the third LC parallel resonator and the fourth LC parallel resonator are capacitively coupled to each other.

17. The multilayer LC filter according to claim 10, wherein the first LC parallel resonator and the fourth LC parallel resonator are jump-capacitive coupled to each other, the first LC parallel resonator and the third LC parallel resonator are jump-capacitive coupled to each other, and the second LC parallel resonator and the fourth LC parallel resonator are jump-capacitive coupled to each other.

18. The multilayer LC filter according to claim 1, wherein the multilayer LC filter is a four stage band pass filter.

19. A multilayer LC filter to transfer a signal from an input terminal to an output terminal, the multilayer LC filter comprising:
a multilayer body in which multiple dielectric layers are laminated; and
multiple LC parallel resonators provided in the multilayer body and electromagnetically coupled to each other; wherein
the multilayer body includes:
a first line-shaped conductor pattern, a second line-shaped conductor pattern, and a third line-shaped conductor pattern between adjacent ones of the dielectric layers;
a first capacitor conductor pattern, a second capacitor conductor pattern, and a third capacitor conductor pattern between adjacent ones of the dielectric layers; and
at least one ground conductor pattern between adjacent ones of the dielectric layers;
the multiple LC parallel resonators include a first LC parallel resonator, a second LC parallel resonator, and a third LC parallel resonator;
the first LC parallel resonator includes the first line-shaped conductor pattern, a first open via conductor connecting the first line-shaped conductor pattern and the first capacitor conductor pattern, and a first short-circuit via conductor connecting the first line-shaped conductor pattern and the at least one ground conductor pattern;
the second LC parallel resonator includes the second line-shaped conductor pattern, a second open via conductor connecting the second line-shaped conductor pattern and the second capacitor conductor pattern, and a second short-circuit via conductor connecting the second line-shaped conductor pattern and the at least one ground conductor pattern;
the third LC parallel resonator includes the third line-shaped conductor pattern, a third open via conductor connecting the third line-shaped conductor pattern and the third capacitor conductor pattern, and a third short-circuit via conductor connecting the third line-shaped conductor pattern and the at least one ground conductor pattern;
when the multilayer body is seen through in a height direction of the multilayer body:
the first open via conductor is closer to the second open via conductor than to the second short-circuit via conductor and closer to the third open via conductor than to the third short-circuit via conductor; and
the second open via conductor is closer to the third open via conductor than to the third short-circuit via conductor; and
a short-circuit via conductor of at least one of the multiple LC parallel resonators and a short-circuit via conductor of at least another one of the multiple LC parallel resonators are connected at a connection point, and the connection point and the at least one ground conductor pattern are connected by a common short-circuit via conductor.

20. A multilayer LC filter to transfer a signal from an input terminal to an output terminal, the multilayer LC filter comprising:
a multilayer body in which multiple dielectric layers are laminated; and
multiple LC parallel resonators provided in the multilayer body and electromagnetically coupled to each other; wherein
the multilayer body includes:
a first line-shaped conductor pattern, a second line-shaped conductor pattern, and a third line-shaped conductor pattern between adjacent ones of the dielectric layers;
a first capacitor conductor pattern, a second capacitor conductor pattern, and a third capacitor conductor pattern between adjacent ones of the dielectric layers; and
at least one ground conductor pattern between adjacent ones of the dielectric layers;
the multiple LC parallel resonators include a first LC parallel resonator, a second LC parallel resonator, and a third LC parallel resonator;
the first LC parallel resonator includes the first line-shaped conductor pattern, a first open via conductor connecting the first line-shaped conductor pattern and the first capacitor conductor pattern, and a first short-circuit via conductor connecting the first line-shaped conductor pattern and the at least one ground conductor pattern;
the second LC parallel resonator includes the second line-shaped conductor pattern, a second open via conductor connecting the second line-shaped conductor pattern and the second capacitor conductor pattern, and a second short-circuit via conductor connecting the second line-shaped conductor pattern and the at least one ground conductor pattern;
the third LC parallel resonator includes the third line-shaped conductor pattern, a third open via conductor connecting the third line-shaped conductor pattern and the third capacitor conductor pattern, and a third short-circuit via conductor connecting the third line-shaped conductor pattern and the at least one ground conductor pattern; and when the multilayer body is seen through in a height direction of the multilayer body:

the first open via conductor is closer to the second open via conductor than to the second short-circuit via conductor and closer to the third open via conductor than to the third short-circuit via conductor;

the second open via conductor is closer to the third open via conductor than to the third short-circuit via conductor;

the first open via conductor, the second open via conductor, and the third open via conductor are each located in a vicinity of a center of the multilayer body;

the first short-circuit via conductor, the second short-circuit via conductor, and the third short-circuit via conductor are each located in a vicinity of a peripheral edge of the multilayer body; and the first line-shaped conductor pattern, the second line-shaped conductor pattern, and the third line-shaped conductor pattern each radially extend from the vicinity of the center toward the vicinity of the peripheral edge.

\* \* \* \* \*